United States Patent [19]

Funaba et al.

[11] Patent Number: 5,880,489
[45] Date of Patent: *Mar. 9, 1999

[54] SEMICONDUCTOR PHOTODETECTOR

[75] Inventors: Shinji Funaba; Eitaro Ishimura, both of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 626,565

[22] Filed: Apr. 2, 1996

[30] Foreign Application Priority Data

Jul. 31, 1995 [JP] Japan ................................. 7-195291

[51] Int. Cl.$^6$ ...................... H01L 31/0304; H01L 31/075
[52] U.S. Cl. ......................... 257/184; 257/458; 257/436
[58] Field of Search .................... 257/458, 436, 257/184, 459

[56] References Cited

U.S. PATENT DOCUMENTS

| | | | |
|---|---|---|---|
| 5,346,837 | 9/1994 | Funaba | 438/91 |
| 5,352,628 | 10/1994 | Funaba | 438/508 |
| 5,684,307 | 11/1997 | Ishimura | 257/459 |

FOREIGN PATENT DOCUMENTS

| | | | |
|---|---|---|---|
| 0163546 | 12/1985 | European Pat. Off. | |
| 286 348 A | 10/1988 | European Pat. Off. | 257/458 |
| 3608359 | 9/1987 | Germany | |
| 63-199467 | 8/1988 | Japan | |
| 1-125989 | 5/1989 | Japan | |
| 2-117181 | 5/1990 | Japan | 257/458 |
| 3-80573 | 4/1991 | Japan | 257/436 |
| 3-109779 | 5/1991 | Japan | 257/436 |

OTHER PUBLICATIONS

C. Cheng, et al., "Monolithically Integrated Receiver Front End: InGaAs p–i–n amplifier," IEEE Trans. Electron Devices, vol. 35, No. 9, Sep. 1988, pp. 1439–1444.

S. M. Sze, "Physics of Semiconductor Devices," 2nd Ed., 1981, p. 706.

Yonezu, "Optical Communciation Device Technology", pp. 372–373 and 418–419, 1984.

Niloy K. Dutta, "III–V Device Technologies For Lightwave Applications", AT&T Technical Journal, vol. 68, No. 1, Jan. 1, 1989, pp. 5–18.

Kuchibhotla et al., "Low–Voltage High–Gain Resonant–Cavity Avalanche Photodiode", IEEE Photoniks Technology Letters, vol. 3, No. 4, Apr. 1, 1991, pp. 354–356.

*Primary Examiner*—John Guay
*Attorney, Agent, or Firm*—Leydig, Voit & Mayer

[57] ABSTRACT

A semiconductor device includes a laminated layer structure including at least one semiconductor layer disposed on a first conductivity type semiconductor substrate, a semi-insulating semiconductor layer disposed on the semiconductor laminated layer structure, a second conductivity type semiconductor region disposed on the front surface of the semi-insulating semiconductor layer, a first electrode on the rear surface of the substrate, and a second electrode disposed on the semi-insulating semiconductor layer and in ohmic contact with the second conductivity type semiconductor region. The junction of the semi-insulating semiconductor layer and the second conductivity type semiconductor region does not form a pn junction, the second conductivity type semiconductor region is surrounded by the semi-insulating material, and the leakage current is suppressed so that, without increasing the dark current, the size of the light responsive region can be made close to the size of an incident light spot, and the pn junction capacitance can be reduced while reducing the pn junction area, resulting in a semiconductor device operating at high speed.

2 Claims, 13 Drawing Sheets

○ : pinPD having
   n⁻-InP window layer 4

● : pinPD having
   Fe-InP window layer 17

SEMICONDUCTOR PHOTODETECTOR

FIELD OF THE INVENTION

The present invention relates to a semiconductor device comprising InP series material used for 10 Gbps high-speed optical communication, and a method of fabricating the semiconductor device.

BACKGROUND OF THE INVENTION

FIG. 20 is a cross-sectional view illustrating a prior art pin photodiode (hereinafter referred to as pin PD) provided with an InGaAs light absorbing layer according to the prior art. In FIG. 20, reference numeral 1 designates a high dopant concentration n type (hereinafter referred to as $n^+$-) InP substrate including an n type dopant impurity, such as S (sulfur) or Si (silicon), in a concentration of $1\times10^{18}$ cm$^{-3}$ and having a thickness of 200 μm. Reference numeral 2 designates an n type (hereinafter referred to as n-) InP buffer layer including an n type dopant impurity in a concentration of $1\times10^{17}$ cm$^{-3}$ and having a thickness of about 1 μm. Reference numeral 3 designates a low dopant concentration n type (hereinafter referred to as $n^-$-) InGaAs light absorbing layer including an n type dopant impurity in a concentration of $1\times10^{15}$ cm$^{-3}$ and having a thickness of about 3 μm. Reference numeral 4 designates an $n^-$-InP window layer including an n type dopant impurity in a concentration of $1\times10^{14}$~$1\times10^{15}$ cm$^{-3}$ and having a thickness of about 2 μm. Reference numeral 5 designates a p type region having a circular surface formed by Zn diffusion with its diameter of about 60 μm and having a dopant concentration of $1\times10^{17}$ cm$^{-3}$~$1\times10^{20}$ cm$^{-3}$. Reference numeral 6 designates a p type (hereinafter referred to as p-) InGaAs contact layer including a p type dopant impurity to a concentration of $1\times10^{19}$ cm$^{-3}$ and having a thickness of about 0.2 μm. The contact layer has an annular surface with an internal diameter of about 50 μm and a width of about 5 μm, and the center of the annular surface is positioned at the center of the circular p type region. Reference numeral 7 designates a reflection preventing film (passivation film) comprising such as SiN and having a thickness of about 1500 Å, disposed on the $n^-$InP window layer 4 other than the region where the contact layer 6 is formed. Reference numeral 8 designates a p side electrode disposed on the contact layer 6, and a portion thereof extending onto a region where the contact layer 6 is not present. The extended portion provides a bonding pad region B which is used for wire bonding. Reference numeral 9 designates an insulating film such as SiO$_2$ having a thickness of about 4000 Å and disposed between the bonding pad region B of the p side electrode 8 and the reflection preventing film 7. Reference numeral 10 designates an n side electrode provided on the rear surface of the substrate 1. In addition, character L denotes a distance between the outer contour of the InGaAs contact layer 6 and the outer contour of the Zn diffusion region 5 at the surface of the window layer 4. Reference numeral 5a designates a light responsive region.

A description is given of the operation of the prior art pin PD. First of all, when a reverse bias current flows so that the p side electrode 8 becomes minus and the n side electrode 10 becomes plus, a depletion layer is formed from the pn junction plane between the p type region 5 and the $n^-$-InGaAs light absorbing layer 3 toward the direction of the $n^+$-InP substrate 1. Then, when the light is applied at the front surface of the $n^-$-InP window layer 4 to the $n^-$-InGaAs light absorbing layer 3 in the depletion layer, carriers are excited in the $n^-$-InGaAs light absorbing layer 3, and a photoelectric current flows in accordance with the quantity of incident light.

The prior art InGaAs-pin PD has two problems because the window layer 4 comprises $n^-$-InP. First, a bonding pad capacitance is produced between the bonding pad region B of the electrode 8 and the lower surface of the depletion layer that is generated at the upper portion of the window layer 4 when the reverse bias is applied, and this capacitance is determined by the sum of the capacitance of the insulating film, such as the SiN reflection preventing film 7 formed on the surface of the window layer 4, and the capacitance of the depletion layer. Usually in the PD, since a reduction in the capacitance of the device enhances the high-speed response of the device, the device has an insulating film 9 such as SiO$_2$ between the window layer 4 and the bonding pad region B of the electrode 8, which insulating film 9 is as thick as possible, to reduce the bonding pad capacitance. However, since there is a limitation in providing such an insulating film 9, it is impossible to reduce the bonding pad capacitance easily.

Second, in order to reduce the capacitance of the pin PD, the diffusion radius of the p type region 5 forming the pn junction capacitance with the n type semiconductor layer is made closer to the light responsive radius of the light responsive region 5a, and the pn junction area is made small. However, when the distance L is shortened, the dark current increases with an increase in the leakage current flowing at the interface between the reflection preventing film 7 and the window layer 4 through the contact layer 6 from the p side electrode 8. Therefore, it is impossible to minimize the diffusion radius of the p type region 5, and it is impossible to reduce the pn junction capacitance. Because of these two problems in the prior art pin PD, there is a limitation in reducing the device capacitance, and it is difficult to realize high-speed operation of the device.

FIG. 21 is a cross-sectional view illustrating an avalanche photodiode (hereinafter referred to as APD) provided with the InGaAs light absorbing layer according to the prior art. In FIG. 21, the same reference numerals as in FIG. 20 designate the same or corresponding parts. Reference numeral 25 designates an n-type hole accumulation prevention layer comprising n type InGaAsP including an n type dopant impurity in a concentration of $1\times10^{15}$ cm$^{-3}$ and having a thickness of about 0.2 μm, and disposed so that the holes generated in the light absorbing layer 3 easily move toward the p type region 5. Reference numeral 11 designates an n-InP multiplication layer including an n type dopant impurity in a concentration of $2\times10^{16}$ cm$^{-3}$ and having a thickness of about 1 μm. Reference numeral 14 designates an $n^-$-InP window layer including an n type dopant impurity in, a concentration of $1\times10^{15}$ cm$^{-3}$ and having a thickness of about 1 μm. Reference numeral 24 designates a guard ring region formed by ion implantation of Be.

A description is given of the operation of the prior art APD. First of all, when a reverse bias current flows so that the p side electrode 8 becomes minus and the n side electrode 10 becomes plus, a depletion layer having a depth reaching the $n^-$-InGaAs light absorbing layer 3 is formed from the pn junction plane between the p type region 5 and the n-InP multiplication layer 11 toward the direction of the $n^+$-InP substrate 1. Then, when light is applied from the surface of the $n^-$-InP window layer 4 to the $n^-$-InGaAs light absorbing layer 3 in the depletion layer, the carriers are excited by the $n^-$-InGaAs light absorbing layer 3, and the carriers are multiplied by the avalanche phenomenon, thereby producing a photoelectric current in accordance with the quantity of the incident light.

The p type region formed by diffusion of Zn atoms usually forms a stepwise pn junction, at the interface between the multiplication layer 11 and the p type region 5 and at the interface between the n⁻-InP window layer 14 and the p type region 5. At the edge part, i.e., the sidewall, of the p type region 5, the electric field is likely to be concentrated because the pn junction interface curved, and edge breakdown is likely to arise. In order to avoid the edge breakdown, in the usual APD, a guard ring region 24 having an inclined pn junction formed by a combination of Be ion implantation and annealing is provided in the vicinity of the edge part. That is, edge breakdown can be prevented by providing the inclined pn junction, which is unlikely to breakdown in place of the stepwise pn junction which is likely to breakdown.

However, since the annealing temperature in producing the guard ring region 24 is extreme, 600°~800° C., dissociations and crystalline defects occur and increase the dark current, and the characteristics of the semiconductor element are degraded. Therefore, it is necessary to prevent dissociation that increases the dark current.

In addition, in the prior art APD, as in the above-described pin PD, since the bonding pad capacitance is not reduced, high-speed operation of the device is not realized.

FIG. 22 is a cross-sectional view illustrating a laser diode (hereinafter refereed to as LD) according to the prior art. In FIG. 22, reference numeral 51 designates an n⁺-InP substrate including an n type dopant impurity, such as S or Si, in a concentration of $5 \times 10^{18}$ cm⁻³. Reference numeral 52 designates an n-InP lower cladding layer including an n type dopant impurity in a concentration of $1 \times 10^{18}$ cm⁻³. Reference numeral 53 designates a p-InP current blocking layer including a p type dopant impurity in a concentration of $1 \times 10^{18}$ cm⁻³. Reference numeral 54 designates an n-InP current blocking layer including an n type dopant impurity in a concentration of $1 \times 10^{17}$ cm⁻³. Reference numeral 55a designates a first p-InP upper cladding layer including a p type dopant impurity in a concentration of $1 \times 10^{18}$ cm⁻³. Reference numeral 55b designates a second p-InP upper cladding layer including a p type dopant impurity in a concentration of $1 \times 10^{18}$ cm⁻³. Reference numeral 56 designates an undoped InGaAs active layer. Reference numeral 57 designates an insulating film such as SiN. Reference numeral 58 designates a p side electrode, and reference numeral 50 designates an n side electrode.

Subsequently, a description is given of the method of fabricating the prior art LD. First of all, the lower cladding layer 52, the undoped InGaAs active layer 56, and the first upper cladding layer 55b are successively epitaxially grown on the substrate 51 by MOCVD as the first epitaxial growth step.

Next, a stripe-shaped insulating film (not shown) is formed on the first upper cladding layer 55b, and using this film as a mask, the etching is selectively performed to reach the lower cladding layer 52 from the surface of the first upper cladding layer 55b, to form a stripe-shaped mesa structure.

Further, using the stripe-shaped insulating film as a mask, the p-InP current blocking layers 53 and the n-InP current blocking layers 54 are successively epitaxially grown so as to bury the mesa structure at opposite sides thereof by MOCVD as the second epitaxial growth step. Then, after the removal of the insulating film, the second upper cladding layer 55b is formed on the mesa structure and the n-InP blocking layers 54 as the third epitaxial growth step. Further, an insulating film 57 having an aperture above the mesa structure is formed on the second upper cladding layer 55b, and the p side electrode 58 is formed on the second upper cladding layer 55b in the aperture and on the insulating film 57, and an n side electrode 50 is formed on the rear surface of the substrate 51, thereby producing a laser diode as shown in FIG. 22.

A description is given of the prior art LD. When a current flows so that the p side electrode 58 becomes plus and the n side electrode 50 becomes minus, the carriers injected from the respective electrodes reach the active layer 56 in the mesa structure, light emitting recombination of carriers occurs, the light is guided along the active layer 56, and the light is emitted as a laser beam. As for the carriers injected from the p side electrode 58 and the n side electrode 50, since the n-InP lower cladding layer 52, the p-InP current blocking layer 53, the n-InP current blocking layer 54, and the second p-InP upper cladding layer 55b are successively laminated to form a thyristor structure (pnpn structure), the carriers do not flow.

As described above, in the prior art LD, a mesa structure is formed as a structure confining the current, and the opposite sides of the mesa structure are buried by the p-InP current blocking layers 53 and the n-InP current blocking layers 54, and the second p-InP upper cladding layer 55b is disposed on the mesa structure and on the n-InP current blocking layers 54. However, in order to fabricate the LD having such a structure, it is necessary to perform three epitaxial growth processes, that is forming the mesa structure, burying the mesa structure, and forming the second p-InP upper cladding layer 55b. As a result, the fabricating processes become quite complicated, and the productivity is quite bad.

In the prior art semiconductor device such as a pin PD, since the window layer 4 comprises n⁻type InP, the bonding pad capacitance cannot be easily reduced, and there is a limitation in making the diffusion radius of light responsive region 5a of the p type region 5 causing a pn junction capacitance close to the radius of the light responsive region, whereby it is impossible to reduce the pn junction capacitance. As a result, it was difficult to realize the high-speed operation of the device.

In the prior art semiconductor device such as an APD, since the annealing temperature while forming the guard ring region 24 is extreme, 600°~800° C., dissociations and crystalline defects occur and the dark current increases, whereby the characteristics of the semiconductor element are degraded. As a result, it is impossible to reduce the bonding pad capacitance, and it is difficult to realize high-speed operation of the device.

In addition, in the prior art semiconductor device such as an LD, since it is necessary to perform three epitaxial growth processes, that is forming the mesa structure, burying the mesa structure, and forming the second p-InP upper cladding layer 55b, the fabricating processes become quite complicated, and the productivity is quite bad.

SUMMARY OF THE INVENTION

It is an object of the present invention to provide a semiconductor device with reduced device capacitance.

It is another object of the present invention to provide a method of fabricating a semiconductor device with the reduced device capacitance.

In is still another object of present invention to provide a semiconductor device that can prevent edge breakdown without increasing the dark current.

It is still another object of the present invention to provide a method of fabricating a semiconductor device that can prevent edge breakdown without increasing dark current.

In is a further object of the present invention to provide a semiconductor device that can be obtained by a simple fabricating method.

It is a further object of the present invention to provide a simple method fabricating a semiconductor device.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor device comprises a semiconductor laminated layer structure comprising one or more semiconductor layers disposed on the front surface of a first conductivity type semiconductor substrate, a semi-insulating semiconductor layer disposed on the semiconductor laminated layer structure, a second conductivity type semiconductor region disposed at a region on the front surface of the semi-insulating semiconductor layer and having a prescribed depth, a first electrode provided on the rear surface of the substrate in ohmic contact with the substrate, and a second electrode disposed on the semi-insulating semiconductor layer in ohmic contact with the second conductivity type semiconductor region. Therefore, in the vicinity of the surface of the semi-insulating semiconductor layer, the junction plane between the semi-insulating semiconductor layer and the second conductivity type semiconductor region does not form the pn junction, the second conductivity type semiconductor region is surrounded by the semi-insulating material, and the leakage current flowing through the vicinity of the surface of the semi-insulating semiconductor layer from the second electrode is suppressed, whereby without increasing the dark current, the size of the second conductive type semiconductor region can be made closer to that of the light responsive region, and the pn junction capacitance can be reduced with reducing the pn junction area of the second conductivity type semiconductor region, resulting in a semiconductor device with high-speed operation and reduced device capacitance.

According to a second aspect of the present invention, in the above-described a semiconductor device, the semiconductor laminated layer structure comprises a first conductivity type light absorbing layer having an energy band gap smaller than the energy band gap of the substrate, the semi-insulating semiconductor layer comprises a semiconductor material having an energy band gap larger than the energy band gap of the light absorbing layer, and the second conductivity type semiconductor region has a depth reaching the light absorbing layer. Therefore, the size of the second conductivity type semiconductor region can be made closer to that of the light responsive region without increasing the dark current, the pn junction area between the second conductivity type semiconductor region and the light absorbing region can be reduced to reduce the pn junction capacitance, resulting in a semiconductor device with high-speed operation and reduced device capacitance.

According to a third aspect of the present invention, in the above-described semiconductor device, the semiconductor laminated layer structure comprises a first conductivity type light absorbing layer having an energy band gap smaller than the energy band gap of the substrate and a first conductivity type multiplication layer having an energy band gap larger than the energy band gap of the light absorbing layer and disposed on the light absorbing layer, the semi-insulating semiconductor layer comprises a semiconductor material having an energy band gap larger than the energy band gap of the light absorbing layer, and the second conductivity type semiconductor region has a depth not reaching the light absorbing layer and forms a stepwise pn junction at the interface between the second conductivity type semiconductor region and the first conductivity type semiconductor region. Therefore, a leakage current does not flow from the second conductivity type semiconductor region toward the semi-insulating semiconductor layer, so that a high performance semiconductor device having suppressed the generation of the edge breakdown without increasing the dark current can be realized.

According to a fourth aspect of the present invention, in the above-described semiconductor device, the second electrode is disposed along the outer contour of the second conductivity type semiconductor region with its portion positioned on the outer contour of the second conductivity type semiconductor region. Therefore, the second electrode can be disposed on the semi-insulating semiconductor layer other than the region where the second conductivity type semiconductor region is provided without being short-circuited, and the size of the second conductivity type semiconductor region can be made closer to that of the light responsive region without increasing the dark current. Further, the pn junction area between the second conductivity type semiconductor region and the light absorbing region can be reduced to reduce the pn junction capacitance, resulting in a semiconductor device with high-speed operation and reduced device capacitance.

According to a fifth aspect of the present invention, in the above-described semiconductor device, the second electrode has a bonding pad region on a region other than the second conductivity type semiconductor region of the semi-insulating semiconductor layer. Therefore, the bonding pad capacitance is made the sum of the bonding pad capacitance of the prior art device and the capacitance of the semi-insulating semiconductor layer, so that the bonding pad capacitance can be reduced, resulting in a semiconductor device with high-speed operation and reduced device capacitance.

According to a sixth aspect of the present invention, in the above-described semiconductor device, the second conductivity type semiconductor region has a depth not reaching the multiplication layer. Therefore, the edge part and the bottom surface of the second conductivity type semiconductor region can be formed inside the semi-insulating semiconductor layer, and the current is made not flow from the entirety of the edge part including the boundary part with the bottom surface of the second conductivity type semiconductor region toward the adjacent semi-insulating semiconductor layer, so that a high performance semiconductor device that has suppressed generation of the edge breakdown without increasing the dark current can be realized.

According to a seventh aspect of the present invention, in the above-described semiconductor device, the second conductivity type semiconductor region has a depth reaching the multiplication layer, and a second conductivity type guard ring region forming an inclined type pn junction at its interface with the first conductivity type semiconductor layer is provided at a region along on the outer contour of the second conductivity type semiconductor region at the surface of the semi-insulating semiconductor layer to cover the edge portion of the second conductivity type semiconductor region. Therefore, no leakage current can be flown from the second conductivity type semiconductor region toward the semi-insulating semiconductor layer even when the crystal of the device is partly dissociated by the annealing while forming the guard ring region, and in the region where the second conductivity type semiconductor region is adjacent to the multiplication layer, the generation of the edge breakdown is suppressed by the guard ring region, whereby a high performance semiconductor device, that has suppressed the generation of the edge breakdown without increasing the dark current in the semiconductor device formed so that the second conductivity type semiconductor region is formed to a depth reaching the multiplication layer, can be realized.

According to an eighth aspect of the present invention, in the above-described semiconductor device, the first conductivity type multiplication layer has a size of the plane larger than the size of the second conductivity type semiconductor region, the semi-insulating semiconductor layer is disposed above the multiplication layer and the light absorbing layer with covering these layers, and the second conductivity type semiconductor region is disposed on a region where the multiplication layer is disposed with its bottom in contact with the multiplication layer and its edge portion not in contact with the multiplication layer. Therefore, the edge part and the bottom surface of the second conductivity type semiconductor region can be formed inside the semi-insulating semiconductor layer, and the current is made not flow from the entirety of the edge part including the boundary part with the bottom surface of the second conductivity type semiconductor region toward the adjacent semi-insulating semiconductor layer, so that a high performance semiconductor device that has suppressed generation of the edge breakdown without increasing the dark current can be realized.

According to a ninth aspect of the present invention, a semiconductor device comprises a light absorbing layer comprising first conductivity type material having an energy band gap smaller than the energy band gap of the substrate and formed at a region on the semi-insulating semiconductor substrate, a semi-insulating semiconductor layer having an energy band gap larger than the energy band gap of the light absorbing layer and disposed on the light absorbing layer and the semiconductor substrate, a second conductivity type semiconductor region having a depth reaching the light absorbing layer and disposed in a prescribed portion of the semi-insulating semiconductor layer on the region where the light absorbing layer is disposed, a first conductivity type semiconductor region having a depth reaching the light absorbing layer and disposed in a prescribed portion of the semi-insulating semiconductor layer on the region where the light absorbing layer is disposed, other than the region where the second conductivity type semiconductor region is formed, a first electrode disposed on the surface of the semi-insulating semiconductor layer in ohmic contact with the first conductivity type region, and a second electrode having a bonding pad region on a region where the light absorbing layer is not disposed and provided on the surface of the semi-insulating semiconductor layer in ohmic contact with the second conductivity type semiconductor region. Therefore, a semiconductor region having a first conductivity type is not disposed at below the bonding pad region B, and the bonding pad capacitance can be made 0, resulting in a semiconductor device with high-speed operation and reduced device capacitance.

According to a tenth aspect of the present invention, a semiconductor device comprises a Bragg reflector comprising two kinds of first conductivity semiconductor layers each having a different refractive index and one-fourth of the wavelength of the incident light which are alternatively laminated and disposed on the first conductivity type semiconductor substrate, a light absorbing layer comprising a first conductivity type semiconductor material having an energy band gap smaller than the energy band gap of the reflection film and the substrate and disposed on the reflection film, a semiconductor layer of a first conductivity type or of a semi-insulating having an energy band gap larger than the energy band gap of the light absorbing layer and disposed on the light absorbing layer, a second conductivity type semiconductor region having a prescribed depth and provided at a region on the surface of the first conductivity type or the semi-insulating semiconductor layer, a first electrode provided on the rear surface of the substrate in ohmic contact with the substrate, and a second electrode disposed on the first conductivity type or semi-insulating semiconductor layer in ohmic contact with the second conductivity type semiconductor region. Therefore, among the incident light applied to the light absorbing layer, the light which is not absorbed by the light absorbing layer is reflected by the Bragg reflector and again applied to the light absorbing layer, whereby the photodiode sensitivity is improved and even when the light absorbing layer is thinned, the sensitivity is not reduced, resulting in a semiconductor device with a thin light absorbing layer and high-speed operation.

According to an eleventh aspect of the present invention, a semiconductor device comprises a doublehetero structure comprising a lower cladding layer comprising a first conductivity type semiconductor material, an active layer, an upper cladding layer comprising a second conductivity type semiconductor material which are successively laminated on the front surface of a first conductivity type semiconductor substrate, in which a width from the surface of the upper cladding layer to a position of a prescribed depth is narrower than the width of the substrate, a semi-insulating semiconductor layer disposed on the doublehetero structure to bury the mesa structure, a second conductivity type semiconductor region provided at a region above the mesa structure of the semi-insulating semiconductor layer to a depth reaching the upper cladding layer, a first electrode provided on the rear surface of the substrate in ohmic contact with the substrate, and a second electrode provided on the semi-insulating semiconductor layer in ohmic contact with the second conductivity type semiconductor region. Therefore, the number of times for performing the epitaxial growth while producing the device is made two times of forming the mesa structure, i.e., a doublehetero structure, and forming the semi-insulating semiconductor layer. Thus, the number of times for epitaxial growth is reduced with relative to forming the prior art semiconductor device, and a semiconductor device which can be easily fabricated is obtained.

According to a twelfth aspect of the present invention, a method for fabricating a semiconductor device includes epitaxially growing a semiconductor laminated layer structure comprising one or more semiconductor layers and a semi-insulating semiconductor layer on the front surface of a first conductivity type semiconductor substrate, forming a second conductivity type semiconductor region by introducing a dopant impurity of a second conductivity type from a predetermined region of the surface of the semi-insulating semiconductor layer, forming a first electrode on the rear surface of the substrate in ohmic contact with the substrate, forming a second electrode on the front surface of the semi-insulating semiconductor layer in ohmic contact with the second conductivity type semiconductor region. Therefore, in the vicinity of the surface of the semi-insulating semiconductor layer, the junction plane between the semi-insulating semiconductor layer and the second conductivity type semiconductor region does not form a pn junction, and the second conductivity type semiconductor region is surrounded by the semi-insulating material, and the leakage current flowing through the vicinity of the surface of the semi-insulating semiconductor layer from the second electrode is suppressed. Thereby, without increasing the dark current, the size of the second conductivity type semiconductor region is made closer to that of the light responsive region, and the pn junction area of the second conductivity type semiconductor region is reduced to reduce the pn junction capacitance, resulting in a semiconductor device with the high-speed operation and the reduced device capacitance. Further, in the vicinity of the surface of the semi-insulating semiconductor layer, the junction plane between the semi-insulating semiconductor layer and the second conductivity type semiconductor region does not from a pn junction, and the second conductivity type semiconductor region is surrounded by the semi-insulating material, and the leakage current flowing through the vicinity of the surface of the semi-insulating semiconductor layer from the second electrode is suppressed.

According to a thirteenth aspect of the present invention, the above-described method further includes forming the second electrode to have a bonding pad region at a region other than the second conductivity type semiconductor region. Therefore, the bonding pad capacitance is made the capacitance that is equal to the sum of the bonding pad capacitance of the prior art device and the capacitance of the semi-insulating semiconductor layer, and the bonding pad capacitance is reduced, resulting in a semiconductor device with the high-speed operation and the reduced device capacitance.

According to a fourteenth aspect of the present invention, a method for fabricating a semiconductor device includes epitaxially growing, on the front surface of a first conductivity type semiconductor substrate, a light absorbing layer comprising a first conductivity type semiconductor material having an energy band gap smaller than the energy band gap of the substrate and a multiplication layer comprising a first conductivity type semiconductor layer having an energy band gap larger than the energy band gap of the light absorbing layer, etching away the multiplication layer remaining the region of a prescribed width portion, epitaxially growing a semi-insulating semiconductor layer on the light absorbing layer and the multiplication layer, introducing a dopant impurity of a second conductivity type into a region on the surface of the semi-insulating semiconductor layer, which region including an upper region of the multiplication layer having the prescribed width and having a size in the flat plane larger than the size of the multiplication layer, to a depth reaching the multiplication layer, thereby forming a second conductivity type semiconductor region having an edge part that does not contact to the multiplication layer, forming a first electrode on the rear surface of the semi-insulating semiconductor substrate in ohmic contact with the first conductivity type semiconductor region, and forming a second electrode on the surface of the semi-insulating semiconductor layer in ohmic contact with the second conductivity type semiconductor region. Therefore, the edge part of the second conductivity type semiconductor region is disposed in the semi-insulating semiconductor layer perfectly including the boundary part with its bottom, the current does not flow toward the adjacent semi-insulating semiconductor layer, whereby a high performance semiconductor device that has suppressed the generation of the edge breakdown without increasing the dark current is realized.

According to a fifteenth aspect of the present invention, a method for fabricating a semiconductor device includes epitaxially growing, on the front surface of a semi-insulating semiconductor substrate, a light absorbing layer comprising a first conductivity type semiconductor material having an energy band gap smaller than the energy band gap of the substrate, etching away the light absorbing layer remaining the region of a predetermined width portion, epitaxially growing a semi-insulating semiconductor layer on the light absorbing layer and the substrate, introducing a dopant impurity of a second conductivity type into a predetermined region on the light absorbing layer of the surface of the semi-insulating semiconductor layer to form a second conductivity type semiconductor region having a depth reaching the light absorbing layer, introducing first conductivity type dopant impurity into the region on the surface of the semi-insulating semiconductor layer above the light absorbing layer other than the second conductivity type region to form a first conductivity type semiconductor region of a depth reaching the light absorbing layer, forming a first electrode on the surface of the semi-insulating semiconductor substrate in ohmic contact with the first conductivity type semiconductor region, and forming a second electrode provided on a region of the surface of the semi-insulating semiconductor layer with a bonding pad region on the region where the light absorbing layer is formed in ohmic contact with the second conductivity type semiconductor region. Therefore, a semiconductor region having a first conductivity type is not disposed at below the bonding pad region B, and the bonding pad capacitance can be made 0, resulting in a semiconductor device with the high-speed operation and the reduced device capacitance.

According to a sixteenth aspect of the present invention, a method for fabricating a semiconductor device includes epitaxially growing successively a light absorbing layer having an energy band gap larger than the energy band gap of the substrate, a multiplication layer comprising a first conductivity type semiconductor material having an energy band gap larger than the energy band gap of the light absorbing layer, and a second conductivity type semiconductor layer having an energy band gap larger than the energy band gap of the light absorbing layer, on the front surface of a first conductivity type semiconductor substrate, providing a diffusion source comprising a compound including the dopant impurity which makes the second conductivity type semiconductor layer semi-insulating on a region other than the predetermined region on the second conductivity type semiconductor layer and annealing this diffusion source to diffuse the dopant impurity mutually with the dopant impurity of a second conductivity type in the second conductivity type semiconductor layer, thereby to make the region other than the predetermined region of the second conductivity type semiconductor layer semi-insulating, removing the diffusion source, forming a first electrode on the rear surface of the substrate in ohmic contact with the substrate, and forming a second electrode on the surface of the second conductivity type semiconductor layer in ohmic contact with the region other than the semi-insulated region of the second conductivity type semiconductor layer. Therefore, the junction plane between the semi-insulating semiconductor layer and the second conductivity type semiconductor region does not form a pn junction, and the second conductivity type semiconductor region is surrounded by the semi-insulating material, and no leakage current is flown from the second conductivity type semiconductor region to the semi-insulating semiconductor layer, so that a high performance semiconductor device having suppressed the generation of the edge breakdown without increasing the dark current can be realized.

According to a seventeenth aspect of the present invention, the above-described method further includes epitaxially growing a semi-insulating semiconductor layer to which the dopant impurity of a second conductivity type included in the second conductivity type semiconductor layer is not likely to be diffused, between the multiplication layer and the second conductivity type semiconductor layer. Therefore, in the process of forming the insulating region in the second conductivity semiconductor layer, a high performance semiconductor device, that can prevent the dopant impurity diffusing from the non-insulated region to the direction of the substrate and control the distance between the non-insulated region of the second conductivity semiconductor layer and the light absorbing layer precisely, can be realized.

According to an eighteenth aspect of the present invention, a method for fabricating a semiconductor device includes successively epitaxially growing a fist conductivity type lower cladding layer, an active layer, and a second conductivity type upper cladding layer on the front surface of a first conductivity type semiconductor substrate to form a doublehetero structure, forming an insulating film having a predetermined width from the surface of the upper cladding layer to a predetermined depth position of the upper cladding layer and etching the doublehetero structure using the insulating film as a mask, thereby to form a mesa structure, after removing the insulating film, forming a semi-insulating semiconductor layer so as to cover the mesa structure on the doublehetero structure, forming a second conductivity type semiconductor region on the mesa structure of the semi-insulating semiconductor layer by introducing the dopant impurity to a depth reaching the upper cladding layer of the mesa structure, forming a first electrode on the rear surface of the substrate in ohmic contact with the substrate, and forming a second electrode on the semi-insulating semiconductor substrate in ohmic contact with the second conductivity type semiconductor region. Therefore, the number of times for performing the epitaxial growth while producing the device is made two times of forming the mesa structure, i.e., a doublehetero structure, and forming the semi-insulating semiconductor layer. Thus, the number of times for epitaxial growth is reduced with relative to forming the prior art semiconductor device, resulting in a semiconductor device which can be easily fabricated

DETAILED DESCRIPTION OF THE PREFERRED EMBODIMENTS

Embodiment 1

Figure 1:
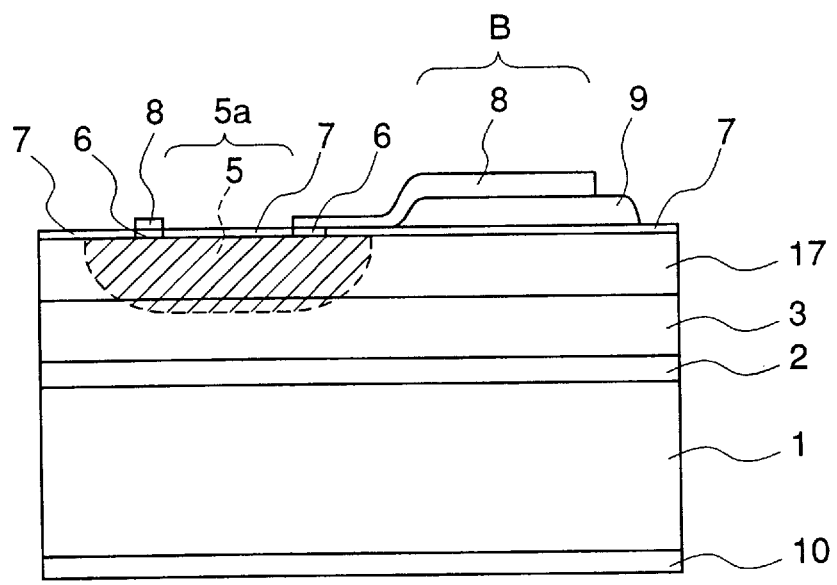
FIG. 1 is a cross-sectional view illustrating a pin PD according to a first embodiment of the present invention.

FIG. 1 is a cross-sectional view illustrating a pin photodiode (hereinafter referred to as pin PD) according to a first embodiment of the present invention. In FIG. 1, reference numeral 1 designates a high dopant concentration n type (hereinafter referred to as n$^+$-) InP substrate including an n type dopant impurity in a concentration of $1 \times 10^{18}$ cm$^{-3}$ and having a thickness of 200 $\mu$m. Reference numeral 2 designates an n type (hereinafter referred to as n-) InP buffer layer including an n type dopant impurity in a concentration of $1 \times 10^{17}$cm$^{-3}$ and having a thickness of about 1 $\mu$m. Reference numeral 3 designates a low dopant concentration n type (hereinafter referred to as n$^-$-) InGaAs light absorbing layer including an n type dopant impurity to a concentration of $1 \times 10^{15}$ cm$^{-3}$ and having a thickness of about 3 $\mu$m. Reference numeral 17 designates an Fe doped InP window layer (hereinafter referred to as Fe—InP window layer) including Fe ions in a concentration of $1 \times 10^{15} \sim 1 \times 10^{18}$ cm$^{-3}$. Since Fe ions form a deep acceptor level in InP and compensate shallow level, donors, so Fermi-level is made positioned in the vicinity of the middle of the energy band gap, Fe makes the InP semi-insulating. Reference numeral 5 designates a p type region having a circular surface which is formed by Zn diffusion with a diameter of 60 $\mu$m, and having a depth reaching the light absorbing layer 3 and a dopant concentration of $1 \times 10^{17} \sim 1 \times 10^{20}$ cm$^{-3}$, in which the depth is adjusted to a depth not reaching the light absorbing layer or a depth reaching the interface between the light absorbing layer 3 and the Fe—InP window layer 17. Although, in place of Zn, a p type dopant impurity, for example, Cd, Mg, or Be may be used, it is preferable to use a p type dopant impurity which is likely to diffuse together with Fe. Reference numeral 6 designates a p type (hereinafter referred to as p-) InGaAs contact layer including Zn atoms in a concentration of $1\times10^{19}$ cm$^{-3}$ and having a thickness of about 0.2 $\mu$m. The contact layer 6 has an annular surface with an internal diameter of about 50 $\mu$m and a width of about 5 $\mu$m, and disposed on the p type region 5 so that the center of the annular surface is positioned on the center of the circular p type region 5. Reference numeral 7 designates a reflection preventing film (passivation film) comprising an insulating film such as SiN and having a thickness of about 1500 Å, and disposed on the Fe—InP window layer 17 at a region other than the region where the contact layer 6 is located. As other material for the insulating film, SiO$_2$, Al$_2$O$_3$, and the like, may be used. Reference numeral 8 designates a p side electrode disposed on the contact layer 6, and a portion extend onto a region where the contact layer 6 is not present. The extended portion provides a bonding pad region B which is used for wire bonding. Reference numeral 9 designates an insulating film such as SiO$_2$ having a thickness of 4000 Å and provided between the bonding pad region B of the p side electrode 8 and the reflection preventing film 7. Reference numeral 10 designates an n side electrode provided on the rear surface of the substrate 1. In addition, reference numeral 5a designates a light responsive region.

FIGS. 3(a)–3(d) are cross-sectional views illustrating process steps in a method of fabricating the pin PD according to the first embodiment of the present invention. In FIGS. 3(a)–3(d), the same reference numerals as in FIG. 1 designate the same or corresponding parts. Reference numeral 6a designates an n$^-$-InGaAs layer including an n type dopant impurity in a concentration of $1\times10^{15}$ cm$^{-3}$ and having a thickness of 0.2 $\mu$m. Reference numeral 6b designates a p-InGaAs region including a p type dopant impurity in a concentration of $1\times10^{19}$ cm$^{-3}$ and having a thickness of about 0.2 $\mu$m. Reference numeral 21 designates a diffusion mask comprising an insulating film such as SiN. Reference numeral 22 designates a solid phase diffusion source comprising compound semiconductor including Zn. In this first embodiment, as this diffusion source, a ZnO/SiO$_2$ film comprising a mixture of ZnO and SiO$_2$ is used. Further, as the n type dopant impurity, for example, S, Sn, or Si may be used.

Figure 3:
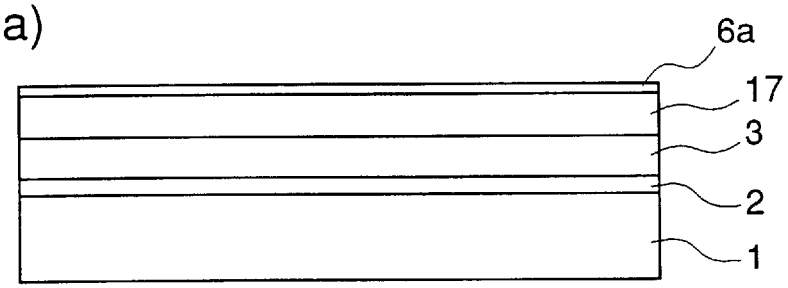
FIGS. 3(a)–3(d) are cross-sectional views illustrating process steps in a method of fabricating the pin PD according to the first embodiment of the present invention.
Figure 3:
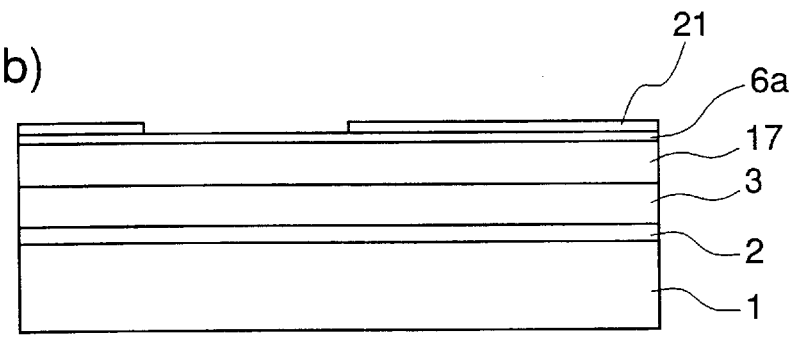
Figure 3:
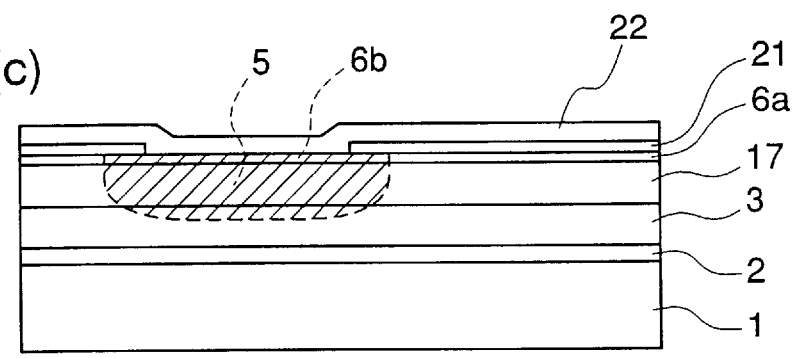
Figure 3:
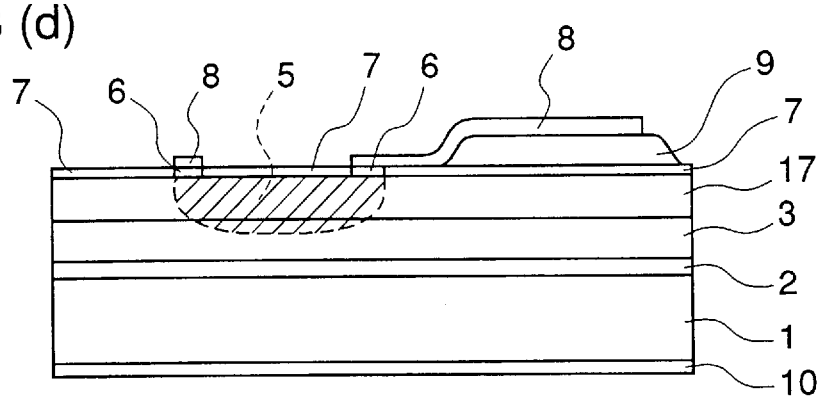

A method of fabricating the pin PD will be described. In the step of FIG. 3(a), on the n$^+$-InP substrate, the n-InP buffer layer 2, the n$^-$-InGaAs light absorbing layer 3, the Fe—InP window layer 17, and the n$^-$-InGaAs layer 6a are successively grown by MOCVD. In the step of FIG. 3(b), the diffusion mask 21 such as SiO$_2$ or SiN is formed by sputtering, and an aperture for diffusing the Zn atoms is formed by photolithographic and etching. In addition, in the step of FIG. 3(c), the solid phase diffusion source 22 comprising an ZnO/SiO$_2$ film is formed on the diffusion mask 21 and the n$^-$-InGaAs layer 6a in the aperture by sputtering, an annealing of about 500° C. is performed so that Zn as a p type impurity is diffused from the solid phase diffusion source 22 to reach the n-InGaAs light absorbing layer 3, whereby the p type region 5 is formed. At this time, in the vicinity of the aperture of the diffusion mask 21, the n$^-$-InGaAs layer 6a changes to the p-InGaAs region 6b including Zn in a concentration of $1\times10^{19}$ cm$^{-3}$. The concentration of the p type dopant impurity in the p type region 5 is preferred to be one order of magnitude higher than the concentration of the Fe ions in the Fe—InP window layer 17.

Subsequently, the solid phase diffusion source 22 and the insulating film mask 21 are etched and removed using a hydrofluoric acid series etchant and the n$^-$-InGaAs layer 6a is etched, and the p type InGaAs region 6b is patterned to form the p-InGaAs contact layer 6 having an annular surface on the surface of the p type region 5.

Further, in the step of FIG. 3(d), the reflection preventing film 7 comprising SiN is formed on the entire surface of the Fe—InP window layer 17 by sputtering or CVD. Then, by the etching, using the resist pattern (not shown), the reflection preventing film 7 on the contact layer 6 is removed. The insulating film 9 such as SiO$_2$ is provided on the region of the reflection preventing film 7 where the bonding pad region B is to be formed and, thereafter, the p side electrode 8 having the bonding pad region B is formed on the contact layer 6 and on the insulating film 9, and the n side electrode 10 is formed on the rear surface of the substrate 1.

A description is given of the operation. First of all, when a reverse bias current flows so that the p side electrode becomes minus and the n side electrode 10 becomes plus, a depletion layer is formed from the lower surface of the p type region 5 toward the direction of the n$^+$-InP substrate 1. Then, when light is applied from the surface of the n$^-$-InP window layer 4 to the n$^-$-InGaAs light absorbing layer 3 in the depletion layer, carriers are excited in the n$^-$-InGaAs light absorbing layer 3 and a photoelectric current flows in accordance with the quantity of the incident light.

Here, in this first embodiment, by using the Fe—InP window layer 17 in place of the n$^-$-InP window layer 4 in the prior art pin PD, the capacitance of the bonding pad region B of the p side electrode 8 becomes the sum of the capacitances of the insulating film 9, the reflection preventing film 7 comprising SiN, the Fe—InP window layer 17, and the depletion layer formed at an upper portion of the n$^-$-light absorbing layer 3, whereby this capacitance can be reduced to about half of the capacitance of the prior art bonding pad region having the same area. For example, when the thickness of the insulating film 9 comprising SiO$_2$ is 8000 Å and the thickness of reflection preventing film 7 comprising SiN is 1500 $\mu$m at the bonding pad region with a diameter of 40 $\mu$m, in the prior art pin PD, since the n$^-$-InP window layer 4 is provided, the capacitance $C_{bp}$ of the bonding pad region is mainly determined by the insulating film capacitance of both the insulating film 9 comprising SiO$_2$ and the reflection preventing film 7 comprising SiN, i.e., $C_{bp}$=50 fF. In this first embodiment, since the Fe—InP window layer 17 with a thickness of 3 $\mu$m is provided, the capacitance $C_{bp}$ of the bonding pad region is determined by the capacitances of the insulating film 9 comprising SiO$_2$, the reflection preventing film 7 comprising SiN, and the Fe—InP window layer 17, i.e., $C_{bp}$=25 fF, becoming about half of the prior art device.

According to the first embodiment of the invention, the n-InP buffer layer 2, the n$^-$-InGaAs light absorbing layer 3, and the Fe—InP window layer 17 are successively formed on the n$^+$-InP substrate 1, the p type region 5 is formed by diffusing Zn atoms into the Fe—InP window layer 17, and the p side electrode 8 having the bonding pad region B and disposed on the contact layer 6 is provided in ohmic contact with the p type region 5. Therefore, the bonding pad capacitance arising at the lower part of the bonding pad region B is the sum of the capacitances of the insulating film 9, the reflection preventing film 7, the Fe—InP window layer 17, and the depletion layer formed at an upper part of the light absorbing layer 3, so that the bonding pad capacitance can be reduced and a high-speed pin PD can be realized.

While in the first embodiment the insulating film 9 such as SiO$_2$ is provided, in the present invention the insulating film 9 such as SiO$_2$ may not be provided. In such case, since it is possible to reduce the device capacitance by using the Fe—InP layer without the insulating film 9 as in the prior art, the process of forming the SiO$_2$ film can be omitted, whereby the pin PD with the reduced device capacitance can be easily produced.

Embodiment 2

Figure 2:
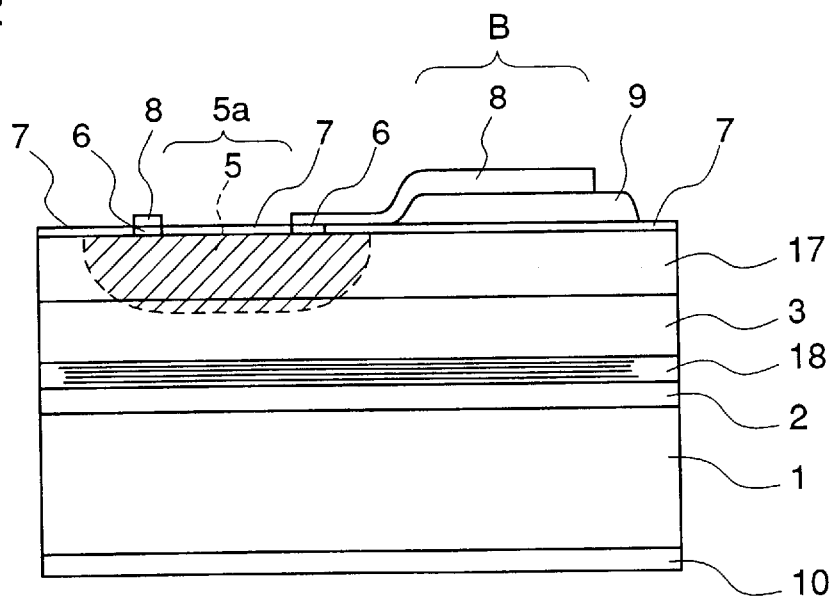
FIG. 2 is a cross-sectional view illustrating a pin PD according to a second embodiment of the present invention.

FIG. 2 is a cross-sectional view illustrating a pin PD according to a second embodiment of the present invention. In FIG. 2, the same reference numerals as in FIG. 1 designate the same or corresponding parts. Reference numeral 18 designates a heterojunction multi-layer reflection film comprising an n type Bragg reflection film which has an energy band gap smaller than the energy band gap of the light absorbing layer 3. This multi-layer reflector 18 is used as, for example, a mirror forming the resonator of a surface emitting laser, and is fabricated by laminating hetero epitaxial layers having thicknesses of one-fourth of the wavelength of the incident light in several to several tens of layers, by MOCVD. In the second embodiment, a multi-layer reflection film 18 comprising 15 to 25 alternating n-InP and InGaAsP layers is used.

Now in the pin PD, for high-speed operation of the device, the n-InGaAs light absorbing layer is made thin, for example 1.5 μm, to reduce the capacitance of the pin PD and reduce the transit time of carriers in the n$^-$-InGaAs light absorbing layer. However, making the light absorbing layer thin makes the region where the light is absorbed narrow, and the sensitivity of the PD, i.e., quantum efficiency η, is degraded.

It is an object of the second embodiment to solve such a problem generated in making light absorbing layer thin. The pin PD according to the second embodiment is fundamentally identical to the pin PD according to the first embodiment except that the n type multi-layer reflection film 18 is formed between the n-InP buffer layer 2 and the light absorbing layer 3. In the epitaxial growth as in the first embodiment, after forming the n-InP buffer layer 2, and before forming the light absorbing layer 3, the multi-layer reflection film 18 is formed, and the epitaxial growth of these layers 2, 18, and 3 is subsequently carried out.

Here, in the second embodiment of the invention, since the pin PD includes the multi-layer reflection film 18, of the incident light applied from the surface of the reflection preventing film 7 and reaching the light absorbing layer 3, the incident light which is not absorbed by the light absorbing layer 3 and passes through the light absorbing layer 3 is reflected by the multi-layer reflection film 18 and then applied again to the light absorbing layer 3. Therefore, the light which is not absorbed once is returned to the light absorbing layer 3 again and then absorbed, thereby improving the sensitivity of the PD. Actually, the result of improving the quantum efficiency η of 60%, i.e., η=90%, is obtained by calculation and observation.

According to the second embodiment of the invention, by an Fe—InP window layer 17, the same effects as in the first embodiment are achieved, and by forming a multi-layer reflection film 18 on the opposite side from the direction to which the light is applied and parallel to the light absorbing layer 3, the incident light which is not absorbed by the light absorbing layer 3 is reflected by the multi-layer reflection film 18 and applied to the light absorbing layer 3 again and absorbed, thereby improving the sensitivity of the pin PD. Therefore, it is possible to make the light absorption layer 3 thin without reducing the sensitivity and realize a pin PD with high-speed operation.

Embodiment 3

Figure 4:
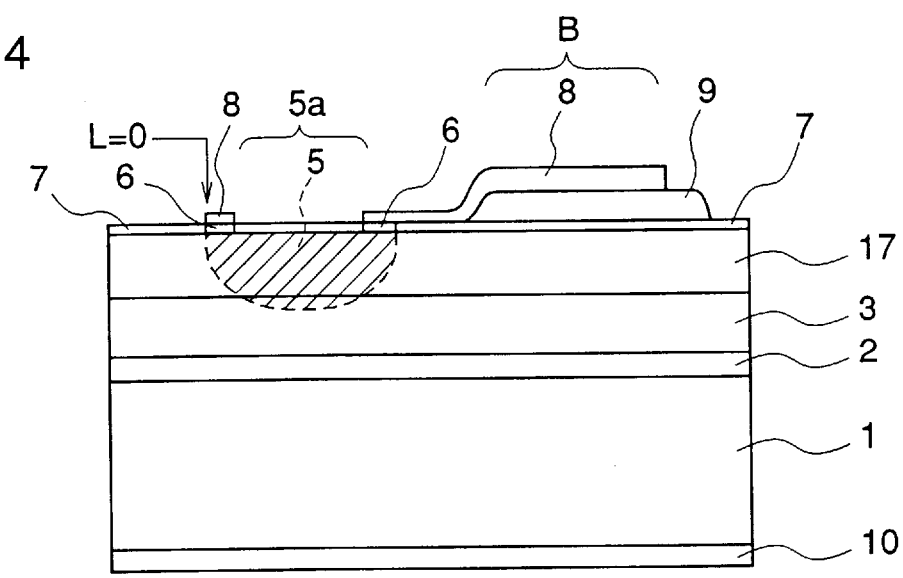
FIG. 4 is a cross-sectional view illustrating a pin PD according to a third embodiment of the present invention.

FIG. 4 is a cross-sectional view illustrating a pin PD according to a third embodiment of the present invention. In FIG. 4, the same reference numerals as in FIG. 1 designate the same or corresponding parts. Reference character L denotes a distance between the outer contour of the p-InGaAs contact layer 6 and the outer contour of the p-type diffusion region 5 at the surface of the Fe—InP window layer 17, and character w denotes a width of the contact layer 6.

Figure 5:
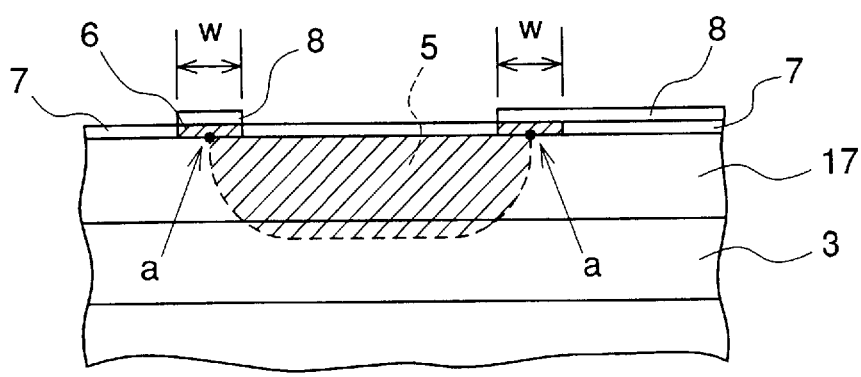
FIG. 5 is a cross-sectional view illustrating a main part of the pin PD according to the third embodiment of the present invention.
Figure 6:
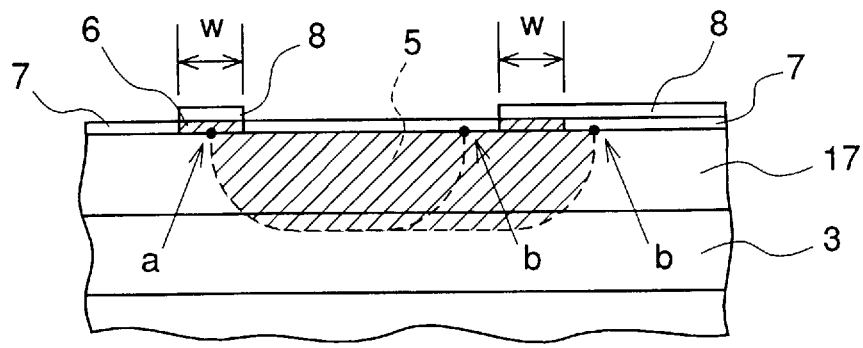
FIG. 6 is a cross-sectional view illustrating a main part of the pin PD according to the third embodiment of the present invention.

FIGS. 5 and 6 are cross-sectional views illustrating a main part of the pin PD according to the third embodiment perpendicular to the substrate. In FIGS. 5 and 6, the same reference numerals as in FIG. 4 designate the same or corresponding parts, and characters a and b denote the points disposed on the outer contour of the p type region 5 at the surface of the Fe—InP window layer 17.

The pin PD according to the third embodiment is fundamentally identical to the pin PD according to the first embodiment except that the contact layer 3 is disposed on the outer contour of the p type region 5, or the contact layer is disposed so that the outer contour of the contact layer is in contact with the outer contour of the p type region 5, and the contact layer is disposed so that the contact layer 6 is electrically connected with the p type region and the contact layer 6 provides a satisfactory ohmic contact between the p type region and the p side electrode 8 which contacts on the contact layer 6.

Figure 20:
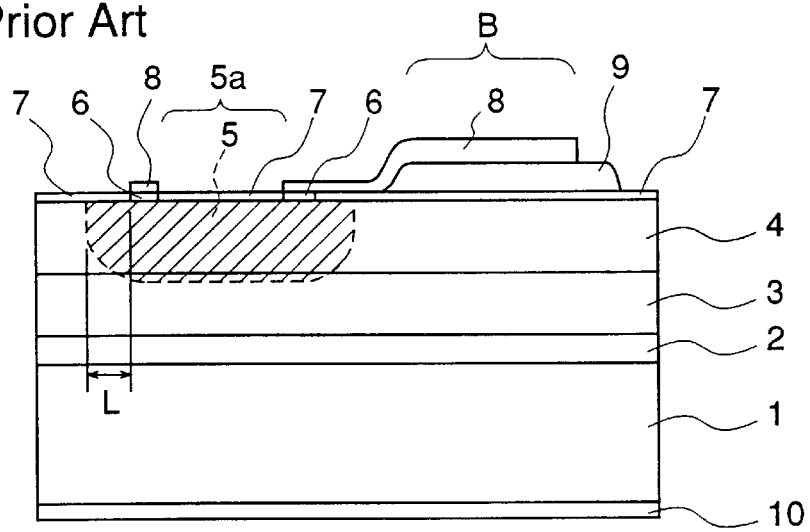
FIG. 20 is a cross-sectional view illustrating a prior art pin PD.
Figure 21:
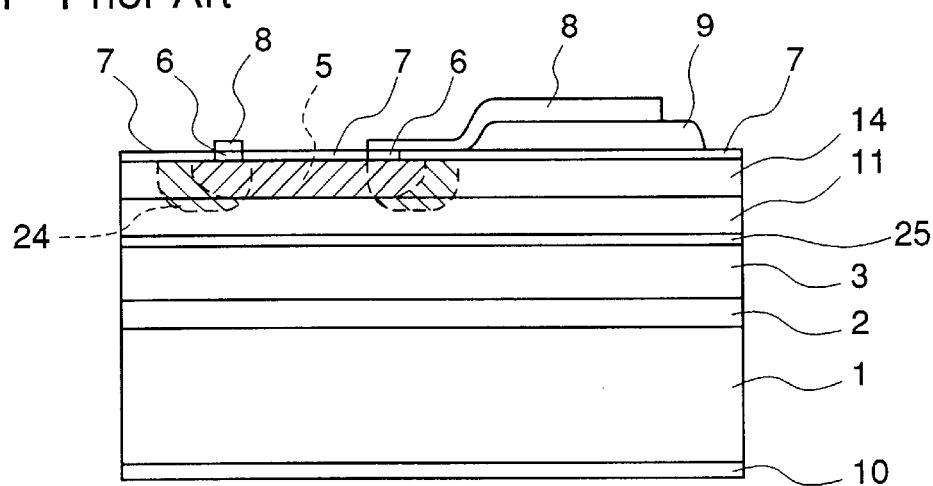
FIG. 21 is a cross-sectional view illustrating a prior art APD.
Figure 22:
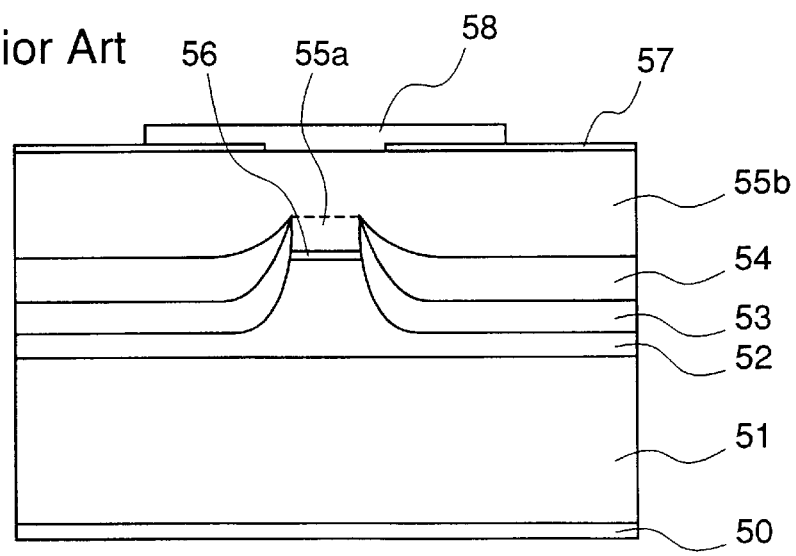
FIG. 22 is a cross-sectional view illustrating a prior art LD.

As described above, in the prior art pin PD as shown in FIG. 20, the device is designed with L>0 μm (1 to several microns) to reduce the dark current. This is because the periphery of the p type region 5 formed by diffusing a p type dopant impurity such as Zn into the n-InP window layer 4 generally, in a case where L=0 μm or L<0 μm, i.e., the contact layer 6 is connected with the window layer 4 other than the p type region 5, the p-InGaAs contact layer 6 or the p side electrode 8 makes a short-circuit at the pn junction increasing the dark current. On the other hand, in the third embodiment, the periphery of the p type region 5 is the Fe—InP window layer 17, i.e., the semi-insulating semiconductor layer, where L>0 μm, the leakage current producing the dark current does not flow from the p type region 5 to the surface of the Fe—InP window layer 17. In addition, even in a case where L≦0 μm, the contact layer 6 or the p side electrode 8 does not short-circuit the pn junction. Therefore, as shown in FIG. 5, the outer contour point a at the surface of the Fe—InP window layer 17 of the p type region 5 may be positioned at the lower region of the p-InGaAs contact layer 6 having a width of W. In addition, as shown in FIG. 6, the dark current does not increase, even when the outer contour point b at the surface of the Fe—InP window layer 17 of the p type region 5 is positioned at a region other than the lower region of the contact layer 6.

Figure 7:
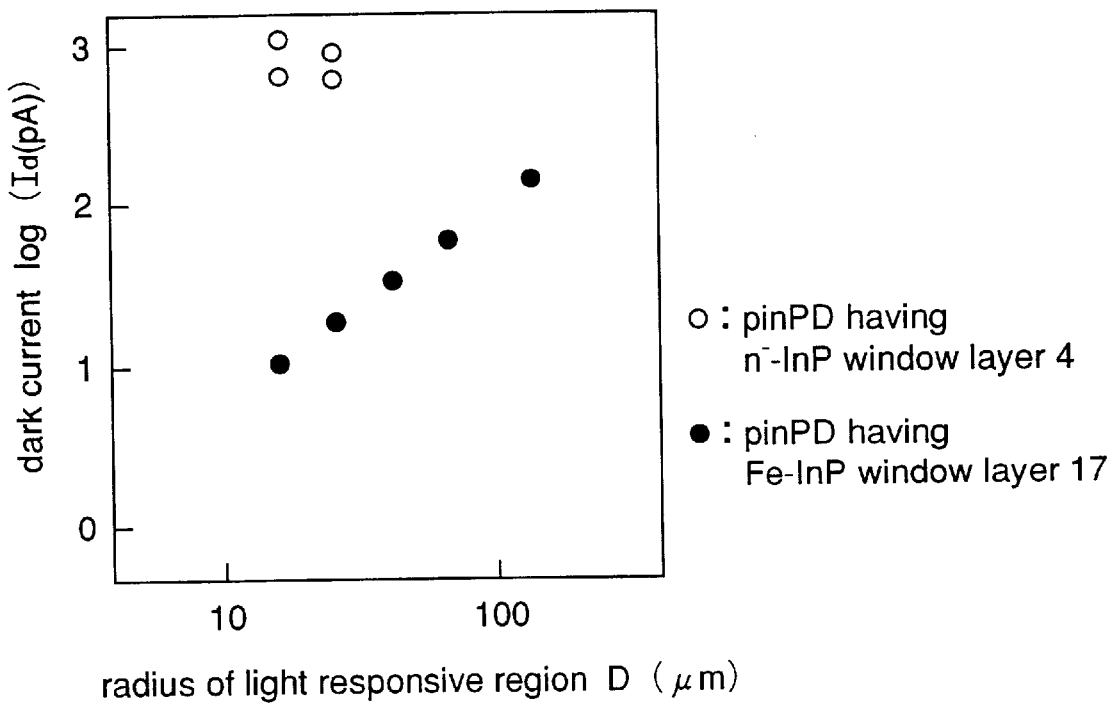
FIG. 7 is a diagram for explaining the relation between the dark current and the radius of the light responsive region of the pin PD according to the third embodiment of the present invention.

FIG. 7 shows a relation between the dark current Id and a light responsive radius in the pin PD comprising the n-InP layer 4 and the pin PD comprising the Fe—InP layer 17, in the case where L=0 μm. In FIG. 7, the abscissa indicates the light responsive radius, i.e., the radius of the light responsive region, and the ordinate indicates the dark current. In addition, white points indicate a pin PD comprising the n-InP window layer 4, and black points indicate a pin PD comprising the Fe—InP window layer 17. As shown in FIG. 7, although in the pin PD comprising the Fe—InP layer 17, the dark current increases with an increase in the light responsive radius, in the pin PD comprising the n-InP layer, the dark current always decreases with an increase in radius.

Assuming that the length of L for preventing the dark current is α, in the prior art pin PD, the diffusion radius which fixes the capacitance of the pn junction, i.e., the diameter at the surface of the p type region, is required to be 2×w+2×α(μm), however, in the third embodiment, the diffusion radius can be smaller by 2×α than that of the prior art pin PD.

In addition, since the positional error of the contact layer is produced by the precision of the photolithographic technique in the fabricating method, it is necessary in the prior art structure, to design so as not to increase the dark current in case of positional error by adding the positional error to the value of α. In the third embodiment, even when positional error of the contact layer 6 occurs for the p type region 5, there is little increase in the leakage current. Therefore, it is not necessary to consider the positional error, and it is possible to reduce the area of the pn junction while reducing the size of the p type region 5.

For example, in the prior art pin PD, assuming that the value of α, taking the precision of photolithographic technique and the planning margin into the consideration is 5 μm, in the present invention the diffusion radius is smaller by 2×α=10 μm than the prior pin PD. As a result, the capacitance of pn junction can be reduced. For example, in a PD required for high-speed operation, usually the minimum measure for the light responsive radius is 20 μm, therefore, in the case where the light responsive radius is 20 μm, the effect of reducing the diffusion radius by 2×α=10 μm reduces the capacitance of pn junction by approximately half. However, in the third embodiment, in order to electrically connect the p-InGaAs contact layer 6 and the p type region 5 and to gain the low contact resistance, it is necessary to connect these layers to a minimum area.

According to the third embodiment, by using the Fe—InP window layer 17 as the window layer, the contact layer 6 having an annular surface is formed so that a portion thereof is positioned on the outer contour or connects with the outer contour, along the outer contour of the window layer 17 of the p type region formed by the Zn diffusion. The p side electrode 8 is disposed on the contact layer 6, so it is possible to reduce the unnecessary pn junction area and decrease the capacitance of the pn junction without increasing the dark current, resulting in a pin PD with the high-speed operation.

Embodiment 4

Figure 8:
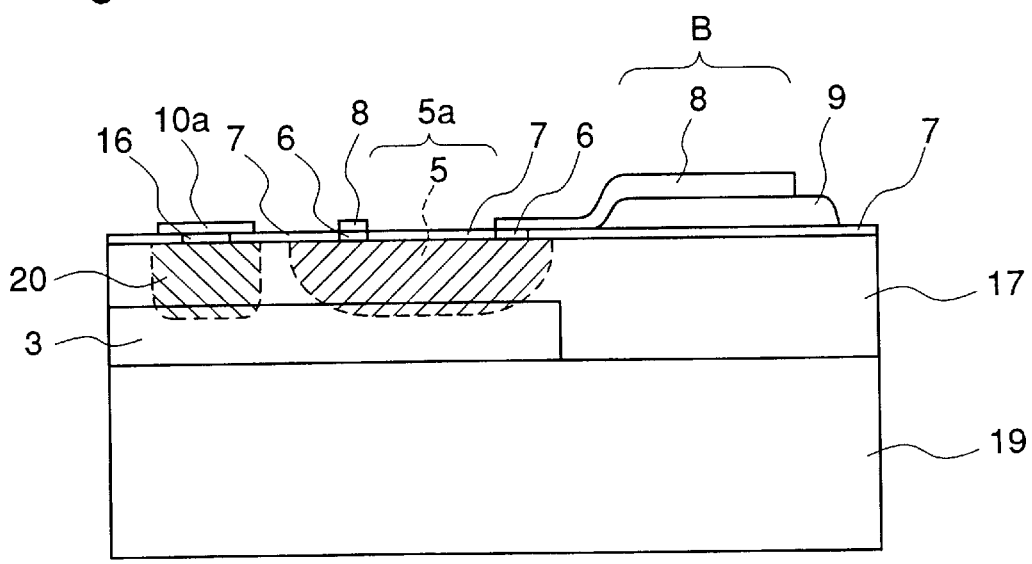
FIG. 8 is a cross-sectional view illustrating a pin PD according to a fourth embodiment of the present invention.

FIG. 8 is a cross-sectional view illustrating a pin PD according to a fourth embodiment of the present invention. In FIG. 8, the same reference numerals as in FIG. 1 designate the same or corresponding parts. Reference numeral 19 designates a semi-insulating Fe—InP substrate including Fe ions in a concentration of $1\times10^{15} \sim 1\times10^{18}$ cm$^{-3}$. Reference numeral 20 designates an n type region including an n type dopant impurity, such as Sn, Si, or S, to a concentration of $1\times10^{18}$ cm$^{-3}$, numeral 16 designates an n-InGaAs contact layer including an n type dopant impurity in a concentration of $1\times10^{16}$ cm$^{-3}$, and numeral 10a designates an n side electrode.

FIGS. 9(a)–9(f) are cross-sectional views illustrating process steps in a method of fabricating the pin PD according to the fourth embodiment. In FIGS. 9(a)–9(f), the same reference numerals as in FIG. 8 and FIGS. 3(a)–3(d) designate the same or corresponding parts. Reference numeral 20c designates an ion implantation, numeral 21a designates a resist, and numeral 6c designates an n type InGaAs region.

The pin PD according to the fourth embodiment is fundamentally identical to the pin PD according to the first embodiment except that using the semi-insulating Fe—InP substrate 19 as the substrate, the n type region 20 having a depth reaching the n-light absorbing layer 3 is disposed on the region of the Fe—InP window layer 17 where the p type region 5 is not present, and the n side electrode 10a is in ohmic contact with this n type diffusion region 20. Further, the Fe—InP layer 17 is formed on the Fe—InP substrate 19 other than the region where the n-InGaAs light absorbing layer 3 is located in a lower region of the bonding pad region B of the p side electrode 8.

Figure 9:
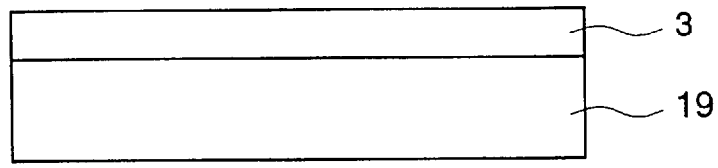
FIGS. 9(a)–9(f) are cross-sectional views illustrating process steps in a method of fabricating a pin PD according to a fourth embodiment of the present invention.
Figure 9:
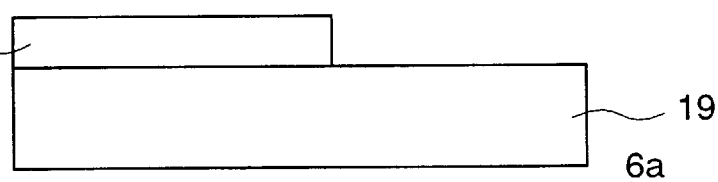
Figure 9:
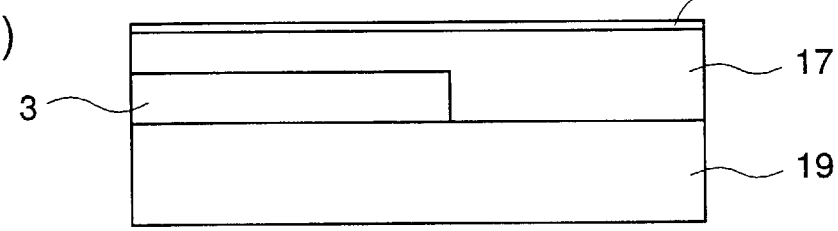
Figure 9:
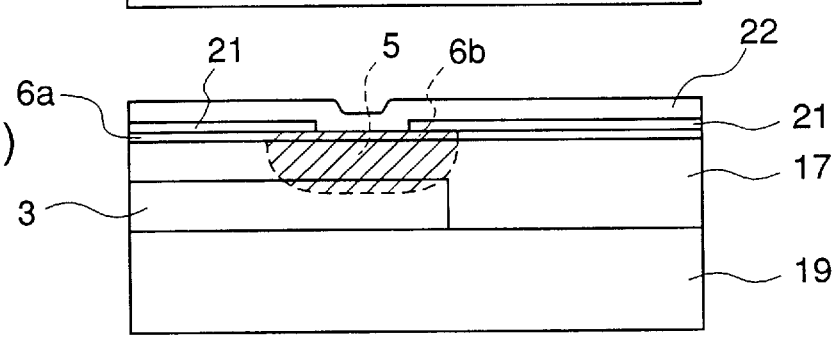
Figure 9:
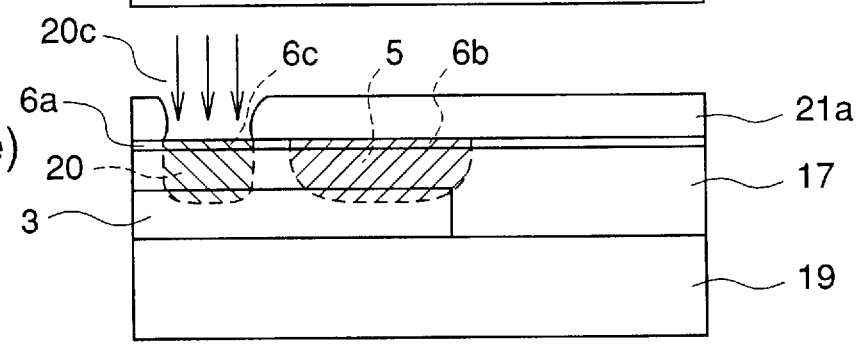
Figure 9:
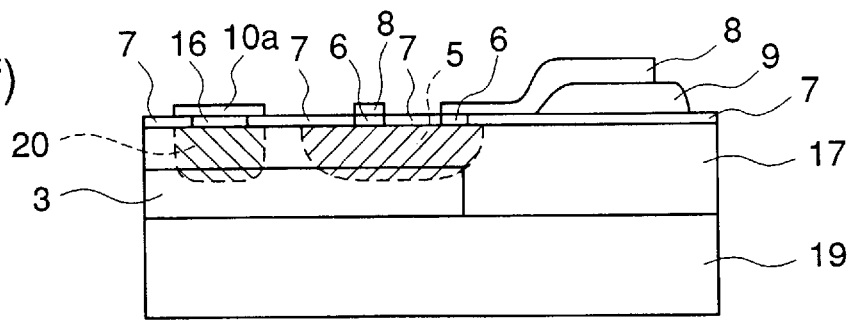

A description is given of the fabricating method. In the step of FIG. 9(a), the Fe—InP substrate 19 is prepared, and the n-InGaAs light absorbing layer 3 is grown on the Fe—InP substrate 19 by MOCVD.

Next, in the step of FIG. 9(b), by using resist, etching is selectively performed in the region of the n-InGaAs light absorbing layer 3 other than the region where the p type region and the n type diffusion region are to be formed, using a Br series etchant, such as Br—CH$_3$OH. The depth of etching is controlled by etching time.

In the step of FIG. 9(c), the Fe—InP window layer 17 and the n-InGaAs contact layer 6a are epitaxially grown by MOCVD. In the step of FIG. 9(d), as in the second embodiment, by using the diffusion mask 21 and the solid phase diffusion source 22 including Zn atoms, Zn is diffused into the region where the n-InGaAs light absorbing layer 3 is present, thereby forming the p type region 5 and the p-InGaAs region 6b. In the step of FIG. 9(e), the resist 21 having an aperture is formed other than where the p type region 5 is located on the n-InGaAs light absorbing layer 3. Then, by ion implantation of S, Si, or Sn as the n type dopant impurity, the n type region 20 and the n type InGaAs region 6c having a depth reaching the n-InGaAs light absorbing layer 3 are formed. After the removal of the resist 21a, the n type InGaAs region 6c and the p-InGaAs region 6b are patterned to form the n type contact layer 16 and p type contact layer 6. Further, the reflection preventing film 7, the insulating film 9, the n side electrode 10a, and the p side electrode 8 are formed as in the first embodiment, so that the pin PD as shown in FIG. 9(f) is obtained. While the ion implantation 20c is conducted when the n type region 20 is formed, this n type region 20 may be formed by the solid phase diffusion as the p type region 5 is formed.

In the pin PD according to the fourth embodiment, since the p type region 5, other than the region contacted by the light absorbing layer 3, is covered with the Fe—InP window layer 17, in the case where the p type contact layer 6 is disposed on the outer contour of the p type region 5 or the p type contact layer 6 is disposed so that the outer contour is contacted, with the outer contour of the p type region 5, it is possible to reduce the capacitance of the pn junction without increasing the dark current as in the third embodiment. In addition, since the n type semiconductor layer or the n side electrode does not exist at the lower part of the bonding pad region B, the capacitance of bonding pad Cbp becomes 0 and the capacitance of the device is reduced.

According to the fourth embodiment, the n-InGaAs light absorbing layer 3 is formed on a region of the semi-insulating Fe—InP substrate 19, and the Fe—InP window layer 17 is formed on the Fe—InP substrate 19 and the n-InGaAs light absorbing layer 3. The p type region 5 and the n type region 20 are formed on a predetermined region of that Fe—InP layer window 17 to a depth reaching the n-InGaAs light absorbing layer 3, and the p side electrode 5 and the n side electrode 10a are formed on the p type region 5 and the n type region 20, respectively. Further, the bonding pad region B of the p side electrode is disposed on the region where the light absorbing layer 3 is not present. Therefore, only the semi-insulating semiconductor layer and the insulating layer are disposed at the lower part of the bonding pad region B of the p side electrode, and the capacitance of the bonding pad becomes 0, resulting in a pin PD for high-speed operation.

While in the first to fourth embodiments the contact layer 6 is formed between the p type region 5 and the p side electrode 8, in the present invention, if the p type region 5 and the p side electrode 8 make ohmic contact to each other sufficiently, a structure having no contact layer may be used, with the same effects as in the first to fourth embodiments.
Embodiment 5

Figure 10:
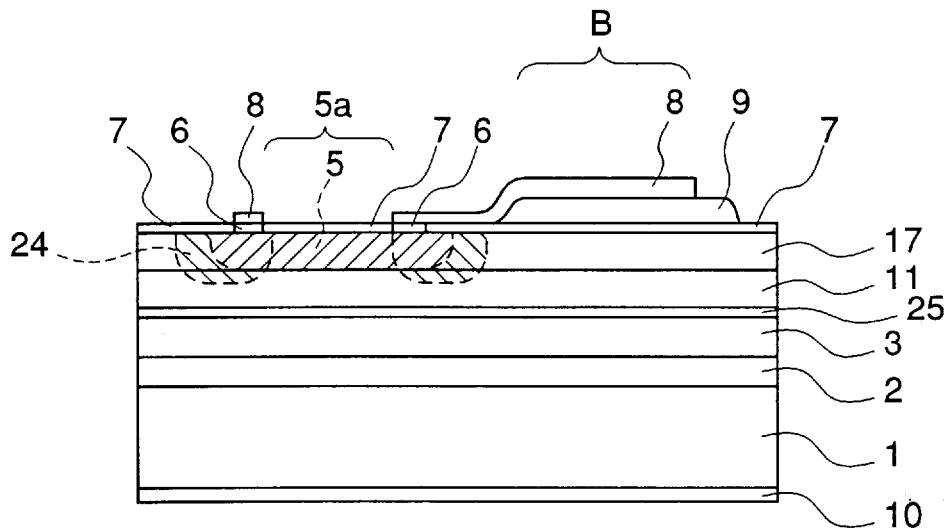
FIG. 10 is a cross-sectional view illustrating an APD according to a fifth embodiment of the present invention.

FIG. 10 is a cross-sectional view illustrating an avalanche photodiode (hereinafter referred as APD) according to a fifth embodiment of the present invention. In FIG. 10, the same reference numerals as in FIG. 1 designate the same or corresponding parts. Reference numeral 25 designates a hole accumulation prevention layer comprising n-InGaAs, and having a thickness of 0.2 $\mu$m and including an n type dopant impurity in a concentration of $1 \times 10^{15}$ cm$^{-3}$, numeral 11 designates an n-InP multiplication layer including an n type dopant impurity in a concentration of $2 \times 10^{16}$ cm$^{-3}$ and having a thickness of about 1 $\mu$m, numeral 24 designates a guard ring region formed by Be ion implantation and including Be in a concentration of $1 \times 10^{17}$ cm$^{-3}$.

Figure 14:
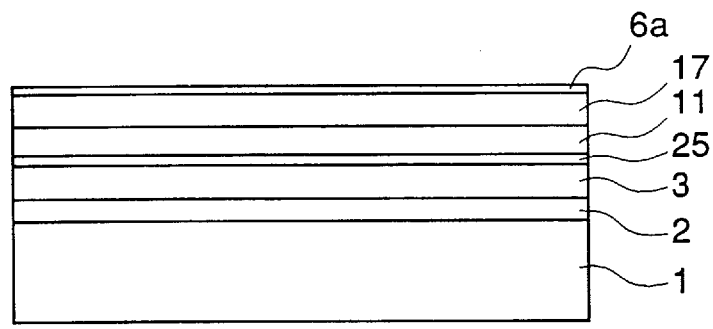
FIGS. 14(a)–14(d) are cross-sectional views illustrating process steps in a method of fabricating a pin PD according to a fifth embodiment of the present invention.
Figure 14:
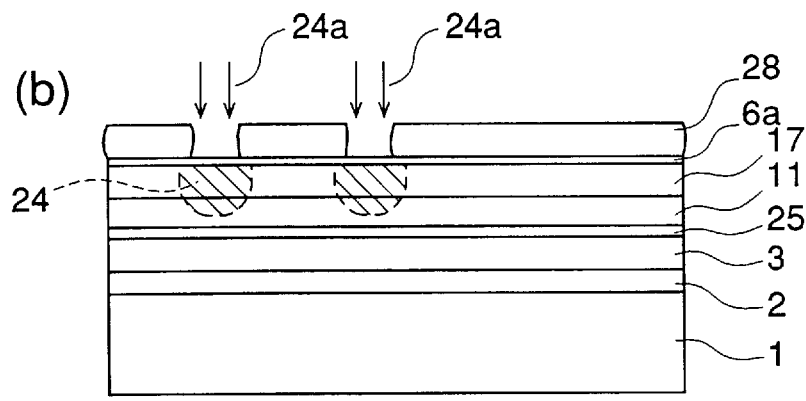
Figure 14:
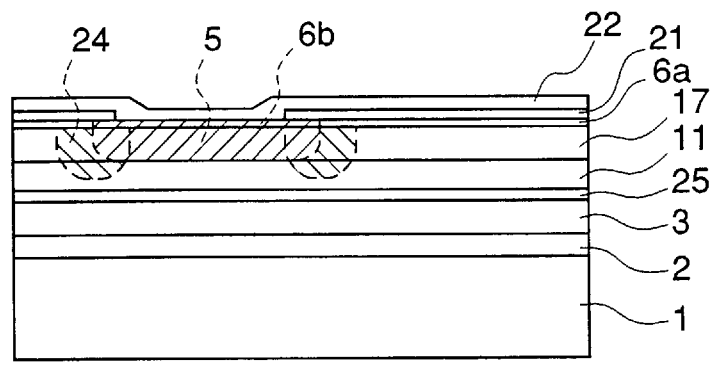
Figure 14:
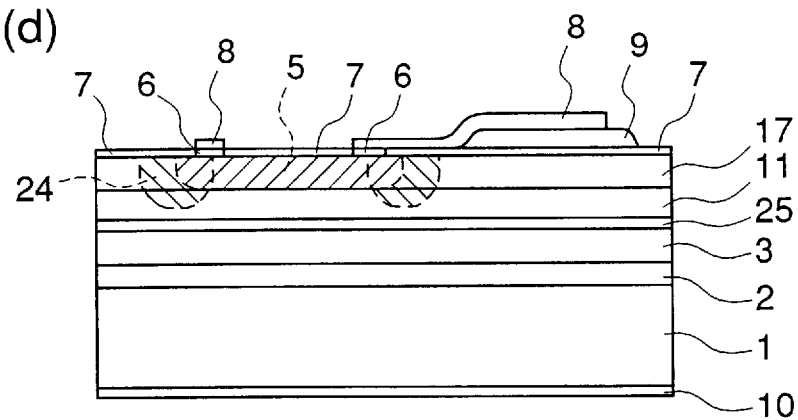

FIGS. 14($a$)–14($d$) are cross-sectional views illustrating process steps in a method of fabricating the APD according to the fifth embodiment. In FIGS. 14($a$)14($d$), the same reference numerals as in FIG. 10 designate the same or corresponding parts. Reference numeral 6$a$ designates an n$^-$-InGaAs layer, numeral 6$b$ designates a p-InGaAs region, numeral 28 designates a resist for forming the guard ring, numeral 21 designates a diffusion mask, numeral 22 designates a ZnO/SiO$_2$ film. As the n type dopant impurity, S, Sn, or Si is generally used.

Next, a method of fabricating the device will be described. In the step of FIG. 14($a$), on the n$^+$-InP substrate 1, the n-InP buffer layer 2, the n$^-$-InGaAs light absorbing layer 3, the hole accumulation prevention layer 25, the n-InP multiplication layer 11, the Fe—InP window layer 7, and the n$^-$-InGaAs layer 6$a$ are successively epitaxially grown by MOCVD.

Subsequently, in the step of FIG. 14($b$), the resist 28 for forming the guard ring 28 having an aperture with an annular surface is formed on the n$^-$-InGaAs layer 6, and ion implantation of Be is performed using the resist 28 as a mask. Then, after the removal of the resist 28, annealing at about 700° C. is carried out. Usually, in this process, the inclined pn junction, that is unlikely breakdown like a stepwise pn junction, is formed in the connecting part of the p type diffusion region and the n type semiconductor layer by combining ion implantation and annealing to introduce the dopant impurity. Therefore, by annealing while performing Be ion implantation, the guard ring region 24 having the inclined pn junction that is unlikely to breakdown is formed in the part where the pn junction is located. The guard ring region 24 has a depth not reaching the hole accumulation prevention layer 25, or in the occasion of having no hole pile-up obstruction layer it has a depth not reaching the light absorbing layer 3.

In the step of FIG. 14($c$), after the removal of the resist 28, the diffusion mask 21 comprising the insulating film such as SiO$_2$, which has a circular aperture with its outer contour positioned on the guard ring region 24, and, as the diffusion sources, the ZnO/SiO$_2$ film is formed on the whole surface of the Fe—InP window layer 17 and, thereafter, the p type region 5 having a depth reaching the interface between the Fe—InP window layer 17 and the n-InP multiplication layer 11 is formed by annealing at about 500° C. This p type region 5 is formed so that the edge which is perpendicular to the substrate, i.e., the sidewall, is positioned wholly within the guard ring region wholly. In addition, during this diffusion, the p type InGaAs region 6$b$ is formed in the aperture of the diffusion mask 21 of the n-InGaAs layer 6.

In the step of FIG. 14($d$), the solid phase diffusion source 22 and the diffusion mask 21 are etched away using the hydrofluoric acid series etchant, and the p type contact layer 6 having the annular surface is formed by the patterning of the p-InGaAs region 6$b$. Then the reflection preventing film 7, the insulating film 9, the p side electrodes 8 having the bonding pad region B, and the p side electrode 10 are successively formed.

Next, a description is given of the operation of the APD according to the fifth embodiment. First of all, when a reverse bias current flows so that the p side electrode becomes minus and the n side electrode 10 becomes plus, a depletion layer having a depth reaching the n$^-$-InGaAs light absorbing layer 3 is formed from the p type region 5 toward the direction of the n$^+$-InP substrate 1. Then, when the light is applied from the surface of the n$^-$-InP window layer 4 to the n$^-$-InGaAs light absorbing layer 3, carriers are excited in the n$^-$-InGaAs light absorbing layer 3 in the depletion layer, and the carriers are multiplied by the avalanche phenomenon, thereby producing a photoelectric current in accordance with the quantity of the incident light.

In the fifth embodiment, by using the Fe—InP layer 17 as a window layer, the capacitance of the bonding pad region B of the p side electrode 8 is determined by the capacitances between the p side electrode 8 and the light absorbing layer 3, that is the total capacitance of the insulating film 9 comprising SiO$_2$, the reflection preventing film 7 comprising SiN, the Fe—InP window layer 17, and the depletion layer formed on the light absorbing layer 3, whereby it is possible to make the bonding pad capacitance lower than the prior art APD having the same area as that of the bonding pad region.

In addition, in the fifth embodiment, since, by using the semi-insulating Fe—InP layer 17 as the window layer, almost all of the edge part, i.e., the sidewall, of the p type region 5 where breakdown is likely to occur is in contact with the Fe—InP window layer and forms no pn junction, edge breakdown is unlikely to occur from p type region 5 toward the window layer 17. While in the prior art APD the guard ring region having the inclined pn junction in the edge part of the p type region, the guard ring effect in the sidewall direction of the p type region 5, i.e., the effect preventing the edge breakdown is improved, in the fifth embodiment the guard ring effect is further improved.

According to the fifth embodiment, the n-InP buffer layer 2, the n-InGaAs light absorbing layer 3, the hole accumulation prevention layer comprising n-InGaAsP, the n-InP multiplication layer 11, and the Fe—InP window layer 17 are successively disposed on the n$^+$-InP substrate 1. By diffusing Zn as the p type dopant impurity to a depth reaching the interface between the window layer 17 and the multiplication layer 11, in the prescribed region of the window layer 17, the p type region 5 forming the stepwise pn junction in the region where it is in contact with the n type semiconductor region is provided, and the guard ring region forming the inclined pn junction so as to cover the edge part of the p type region 5 is provided. Therefore, a pn junction is not formed in the region of the edge part of the p type region 5 contacting the window layer 17, and the edge part of the p type region is covered with the guard ring region having the inclined pn junction in the part contacting the multiplication layer 11 or in the multiplication layer 11, thereby preventing the edge breakdown certainly.

Since the semi-insulating Fe—InP window layer is used as a window layer, the bonding pad capacitance of the p type electrode 8 can be reduced as in the first embodiment.

Embodiment 6

Figure 11:
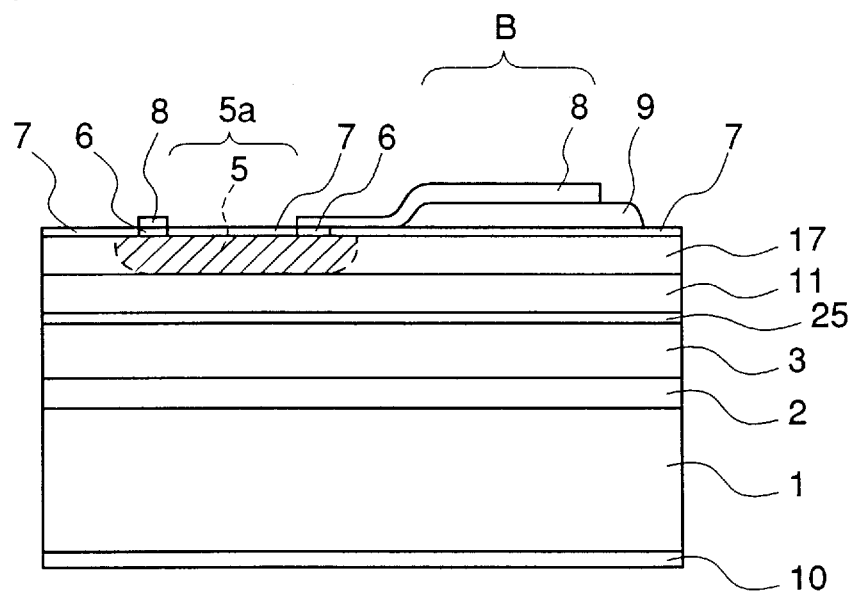
FIG. 11 is a cross-sectional view illustrating an APD according to a sixth embodiment of the present invention.

FIG. 11 is a cross-sectional view illustrating an APD according to a sixth embodiment of the present invention. In FIG. 11, the same reference numerals as in FIG. 10 designate the same or corresponding parts. The APD according to the sixth embodiment is fundamentally identical to the APD according to the fifth embodiment except that no guard ring region 24 is provided because of the omission of the process of forming the guard ring region 24.

As described above, in the prior APD, it is necessary to form the guard ring region 24 utilizing the inclined pn junction by Be ion implantation and annealing for preventing edge breakdown. However, since this process of forming the guard ring region 24 is extreme, especially the annealing temperature of 600°~800° C., which causes dissociation of the InP series compound semiconductor, it is necessary to prevent the dissociation and an increase in the dark current caused by the dissociation.

However, in this sixth embodiment, since most of the edge part of the p type region 5 is formed in the region of the semi-insulating Fe—InP window layer 17, edge breakdown can be prevented without forming the guard ring region 24, and the process of forming the guard ring region 24 is omitted. Therefore, there is no occurrence of the dissociations and the dark current is not increased by dissociation, and a simple fabricating method is achieved. In addition, in the prior art APD, the guard ring region is formed so as to cover the edge part of the p type region, and the area of the pn junction where the guard ring region is connected with the light multiplication layer is larger than the area of the pn junction where the p type region is connected with the light multiplication layer. In the absence of the guard ring region, no capacitance is formed at the position where the guard ring region and the light multiplication layer are connected with each other.

According to the sixth embodiment, the n-InP buffer layer 2, the n$^-$-InGaAs light absorbing layer 3, the hole accumulation prevention layer 25 comprising n$^-$-InGaAs, the n-InP multiplication layer 11, and the Fe—InP window layer 17 are successively disposed on the n$^+$-InP substrate 1. By diffusing Zn as the p type dopant impurity to a depth reaching the interface between the window layer 17 and the multiplication layer 11, in the prescribed region of the window layer 17, the p type region 5 forming the stepwise pn junction in the region where it is in contact with the n type semiconductor region is provided. Therefore, it is possible to prevent the edge breakdown certainly without forming the pn junction in the region where the edge part of the p type region 5 is in contact with the window layer 17 and without forming the guard ring region which requires the annealing at high temperature causing crystal dissociations an increasing the dark current, resulting in a high performance APD that can prevent the edge breakdown without increasing the dark current.

Embodiment 7

Figure 12:
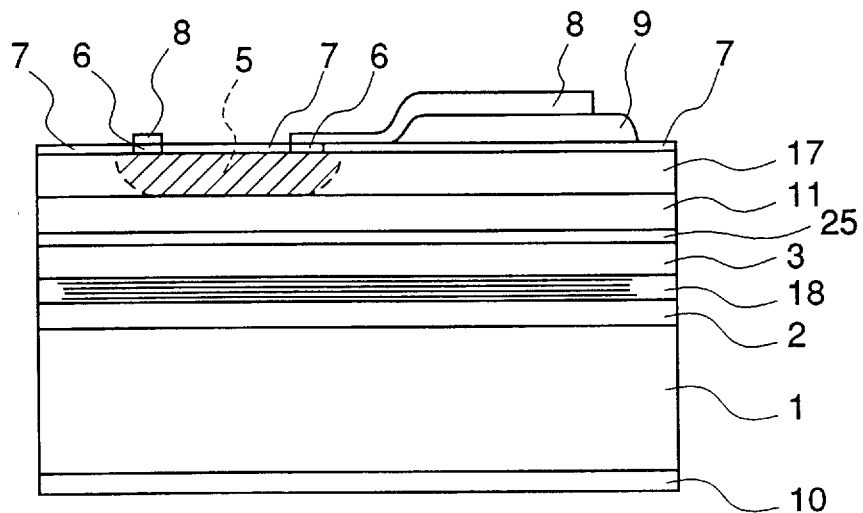
FIG. 12 is a cross-sectional view illustrating an APD according to a seventh embodiment of the present invention.

FIG. 12 is a cross-sectional view illustrating an APD according to a seventh embodiment of the present invention. In FIG. 12, the same reference numerals as in FIG. 10 designate the same or corresponding parts, and reference numeral 18 designates a multi-layer reflection film comprising an InP layer and an InGaAs layer and having the same structure as the multi-layer reflection film described in the second embodiment.

This APD provides the multi-layer reflection film 18 between the n-InP buffer layer 2 and the n$^-$-light absorbing layer 3, and the APD is fabricated as in the sixth embodiment. In the epitaxial growth as in the sixth embodiment, after forming the n-InP buffer layer 2, and before forming the n$^-$-light absorbing layer 3, the multi-layer reflection film 18 is formed by MOCVD, and the epitaxial growth of these layers 2, 18 and 3 is subsequently carried out.

According to the seventh embodiment of the present invention, by using the Fe—InP window layer 17 as the window layer, the same effect as in the sixth embodiment is achieved, and by forming the multi-layer reflection film 18 on the opposite side of the position where the light is applied and parallel to the light absorbing layer 3, the incident light which is not absorbed by the light absorbing layer 3 and passes through the light absorbing layer 3 is reflected by the multi-layer reflection film 18 and then applied to the light absorbing layer 3 again, thereby improving the sensitivity of the APD. Therefore, even if the light absorbing layer 3 is made thin to reduce the transit time of carriers, it is possible to prevent degradation of the sensitivity of the APD, resulting in an APD with high-speed operation and improved sensitivity.

Embodiment 8

Figure 13:
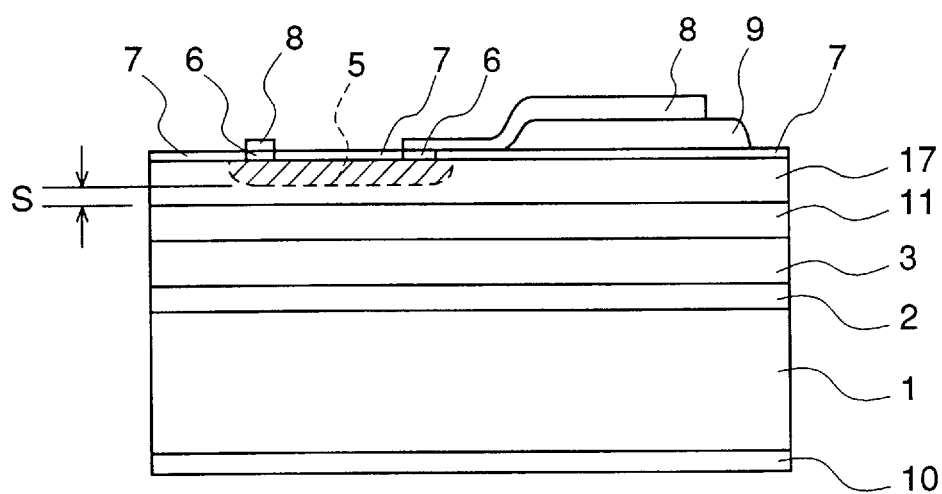
FIG. 13 is a cross-sectional view illustrating an APD according to an eighth embodiment of the present invention.

FIG. 13 is a cross-sectional view illustrating an APD according to a eighth embodiment of the present invention. In FIG. 13, the same reference as in the FIG. 10 designate the same or corresponding parts.

The APD according to the eighth embodiment is fundamentally identical to the APD according to the sixth embodiment except that the p type region 5 has a depth not reaching the multiplication layer 11 and the Fe—InP layer 17 is disposed between the p type region 5 and the multiplication layer 11. The APD according to the eighth embodiment is fabricated by adjusting the diffusion time of Zn as the p type dopant impurity, as in the sixth embodiment.

According to the eighth embodiment, since the same effect as in the sixth embodiment is achieved and the p type region 5 has a depth not reaching the multiplication layer 11, the edge part of whole p type region 5, which includes the interface with the bottom surface, is covered with the semi-insulating Fe—InP layer 17, resulting in an APD that has the improved effect of preventing edge breakdown as compared to the APD according to the sixth embodiment.

Embodiment 9

Figure 15:
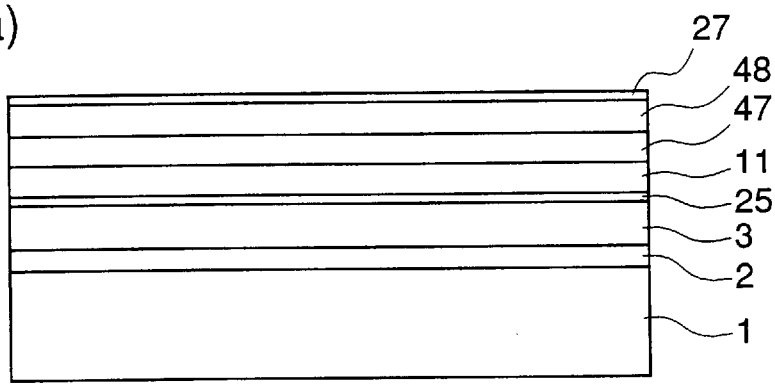
FIGS. 15(a)–15(c) are cross-sectional views illustrating process steps in a method of fabricating a pin PD according to a ninth embodiment of the present invention.
Figure 15:
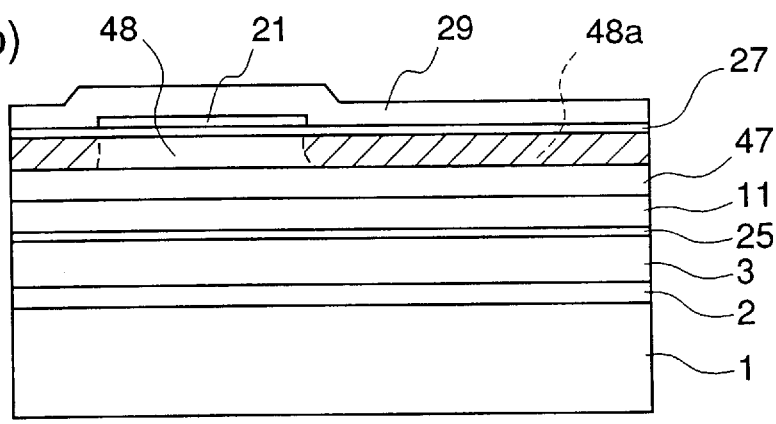
Figure 15:
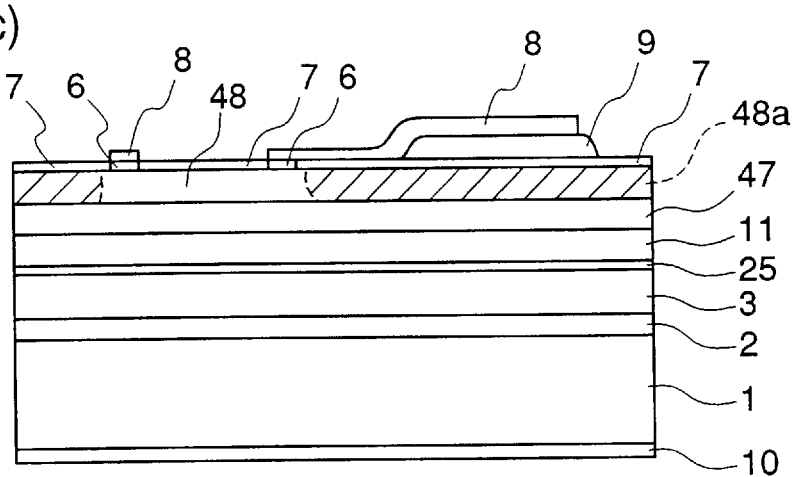

FIGS. 15($a$)–15($c$) are diagrams illustrating process steps in a method of fabricating an APD according to a ninth embodiment of the present invention. In FIGS. 15($a$)–15($c$), the same reference numerals as in FIG. 13 designate the same or corresponding parts. Reference numeral 47 designates a semi-insulating undoped AlInAs layer and numeral 48 designates a p-InP layer including Zn as a p type dopant impurity in a concentration of $1\times10^{17}$ cm$^{-3}$–$1\times10^{20}$ cm$^{-3}$. Reference numeral 48$a$ designates a semi-insulating InP region formed on the p-InP layer 48, numeral 27 designates a p-InGaAs layer including a p type dopant impurity in a concentration of $1\times10^{19}$ cm$^{-3}$, numeral 29 designates a solid phase diffusion source comprising a material which is likely to diffuse with the p type dopant impurity, such as FeO.

A fabricating method will be described. Initially, in the step of FIG. 15($a$), on the n$^+$-InP substrate 1, the n-InP buffer layer 2, the n-InGaAs light absorbing layer 3, the hole pile-up obstruction layer 25 comprising n-InGaAsP, the n-InP multiplication layer 11, the semi-insulating undoped AlInAs layer 47, the p-InP layer 48 including Zn, and the p-InGaAs layer 27 are successively epitaxially grown by MOCVD.

Next, in the step of FIG. 15($b$), the diffusion mask 21 such as SiO$_2$ is formed on the prescribed region of the p-InGaAs layer 27, and on the p-InGaAs layer 27 and the diffusion mask 21, the solid phase diffusion source 29 such as FeO including a dopant impurity such as Fe which is likely to diffuse with Zn of the p-InP layer 48 and becomes the semi-insulating layer when it is diffused with the InP is formed. Then the annealing is performed. By this annealing, Fe of the solid diffusion source 29 and Zn of the p-InP layer 48 diffuse with each other, whereby Fe is implanted in other than the region of the lower parts of the diffusion mask 21 of the p-InP layer 48, and a Zn doped semi-insulating InP region 48 is formed in the p-InP layer 26. In addition, since the undoped AlInAs layer 47 includes no dopant impurity, the diffusion of Zn does not occur. Subsequently, after the diffusion mask 21 and the solid phase diffusion source 29 are etched away using hydrofluoric acid series etchant, the p-InGaAs contact layer 6 is formed by patterning the p-InGaAs layer 27 so that the p-InGaAs layer 27 has an annular surface, and the SiN reflection preventing film 7, the insulating film 9, the n side electrode 8, and the p side electrode 10 are formed as in the above-described sixth embodiment, resulting in an APD as shown in FIG. 15(c).

A description is given of the operation. In the APD according to the ninth embodiment, when a reverse bias current flows the n side electrode and the p side electrode, a depletion layer is formed from the region of the p-InP layer other than the region of the semi-insulating InP region 48a toward the light absorbing layer 3. When the light is applied to the light absorbing layer 3 in the depletion layer, carriers are excited in the light absorbing layer 3 and the carriers are multiplied by the avalanche phenomenon, thereby producing a photoelectric current in accordance with the quantity of the incident light.

In the APD according to the ninth embodiment, since the p type region as the light absorption region, that is the region other than the semi-insulating InP region 48a of the p-InP layer 48, is sandwiched between the semi-insulating InP region 48a and the undoped AlInAs layer 47, the APD has the same effect as in the eighth embodiment. Further, the thickness of the undoped AlInAs layer 47 is controlled by an epitaxial growth process having improved controllability of the thickness, such as MOCVD, whereby it is possible to control the distance between the p-InP layer 48 and the light multiplication layer 11 corresponding to the distance S between the p type region 5 and the light multiplication layer 11 of the APD shown in FIG. 13. It is also possible to control the width Wz functioning essential as the multiplication layer, that is the distance between the p-InP layer 48 as the p type region and the light absorbing layer 3 or the distance between the p-InP layer 48 and the hole accumulation prevention n-InGaAsP layer 25.

According to the ninth embodiment of the present invention, the n-InP buffer layer 2, the n⁻-InGaAs light absorbing layer 3, the hole accumulation prevention layer 25, the n-InP multiplication layer 11, the semi-insulating undoped AlInAs layer 47, Zn doped p-InP layer 48, and the p-InGaAs layer 27 are successively epitaxially grown on the n⁺-InP substrate 1. Fe is diffused into region other than the prescribed region on the p-InGaAs layer 27 to form the semi-insulating InP region 48a, whereby it is possible to obtain the APD. A region of the p-InP layer 48 other than the semi-insulating InP region 48a is covered with the semi-insulating InP region 48a and the semi-insulating undoped AlInAs layer 47, with the same effects as in the above-described eighth embodiment. Further, the undoped AlInAs layer 47 can be formed by an epitaxial growth process which has improved controllability of the thickness, such as MOCVD, resulting in a high performance APD that can control the width functioning as the multiplication layer with high accuracy.

While, in the ninth embodiment, by using the undoped AlInAs layer 47 as the layer which is disposed under the p-InP layer 48, when Fe of the solid phase diffusion source 28 and Zn of the p-InP layer 48 are diffused with each other, Zn is not diffused from the p-InP layer 48 which is the lower part of the diffusion mask 21 to the layer which is disposed under the p-InP layer 48. In the present invention the semi-insulating InP layer including the impurity which is not likely to diffuse with the impurity of the p-InP layer 48, or the layer including the impurity which is not likely to diffuse with the impurity of the p-InP layer and which is likely to lattice-match with InP may be employed in place of the undoped AlInAs layer 47, with the same effect as in the ninth embodiment.

While in the ninth embodiment the semi-insulating InP region is formed by mutually diffusing Fe of the solid diffusion source 28 and Zn of the p-InP layer 48, in the present invention Fe of the solid phase diffusion source 28 may be diffused to a depth reaching the multiplication layer 11 with the same effect as in the ninth embodiment. Further, the region where Fe is diffused in the multiplication layer 11 becomes a semi-insulating region, thereby improving the effect of preventing edge breakdown and reducing the bonding pad capacitance.

While in the ninth embodiment the undoped AlInAs layer 47 is disposed between the multiplication layer 11 and the p-InP layer 48, in the present invention the structure in which the undoped AlInAs layer 47 is not present may be applied. In such a structure, since Zn is diffused from the p-InP layer 48 of the lower part of the diffusion mask 21 to the multiplication layer 11, the APD having the same structure as in the sixth embodiment is achieved.

Embodiment 10

Figure 16:
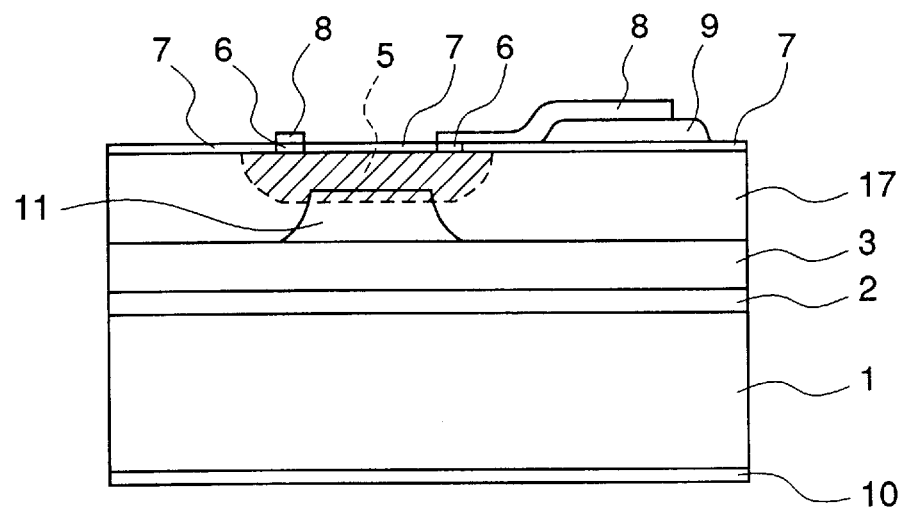
FIG. 16 is a cross-sectional view illustrating an APD according to a tenth embodiment of the present invention.

FIG. 16 is a cross-sectional view illustrating an APD according to a tenth embodiment of the present invention. In FIG. 16, the same reference numerals as in FIG. 10 designate the same or corresponding parts.

FIGS. 18(a)–18(d) are cross-sectional views illustrating process steps in a method of fabricating the APD according to the tenth embodiment. In FIGS. 18(a)–18(d), the same reference numerals as in FIG. 10 designate the same or corresponding parts. Reference numeral 21 designates a diffusion mask comprising the insulating film such as SiN, numeral 31 designates an etching mask comprising the insulating film such as SiN, numeral 32 designates a solid phase diffusion source, numeral 6a designates an n⁻-InGaAs layer, and numeral 6b designates a p-InGaAs region.

The APD according to the tenth embodiment is fundamentally identical to the APD according to the sixth embodiment except that the multiplication layer 11 is formed in a mesa structure directly under the p type region 5, and the edge part of the p type region 5 is entirely positioned in the semi-insulating Fe—InP window layer 17.

Next, a description is given of the method of fabricating the APD according to the tenth embodiment. Initially, in the step of FIG. 18(a), the n-InP buffer layer 2, the n⁻-InGaAs light absorbing layer 3, the hole accumulation prevention layer 25, and the n-InP multiplication layer 11 are successively formed on the n⁺-InP substrate 1.

Figure 18:
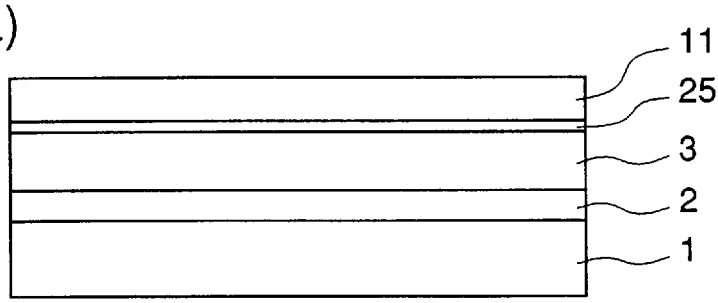
FIGS. 18(a)–18(d) are cross-sectional views illustrating process steps in a method of fabricating an APD according to a tenth embodiment of the present invention.
Figure 18:
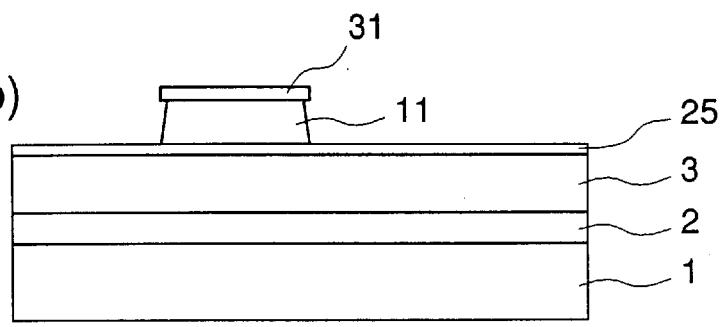
Figure 18:
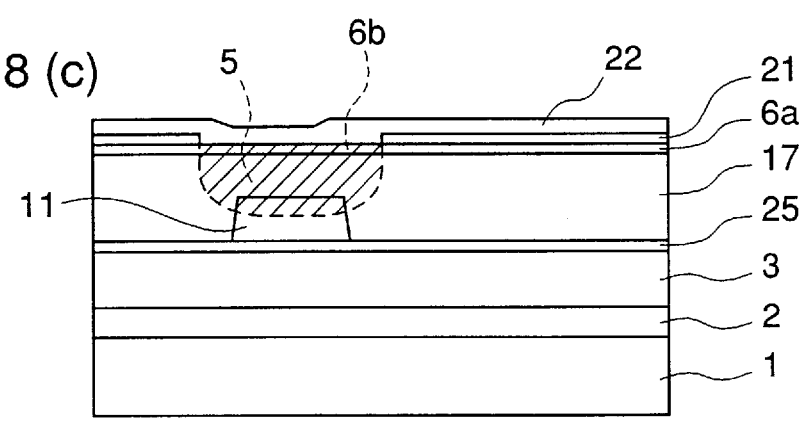
Figure 18:
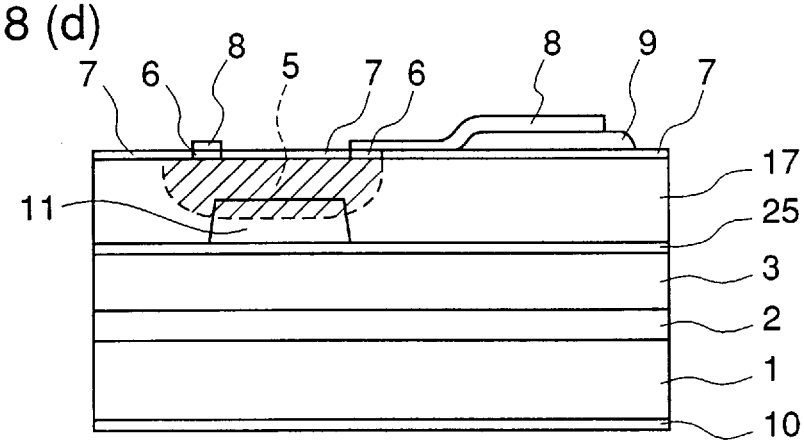

Subsequently, in the step of FIG. 18(b), the etching mask 31 is formed on the region where the light absorption region is to be formed, and using this etching mask 31 as a mask, only the multiplication layer 11 is selectively etched to form a mesa structure using Br series etchant. The depth of etching is controlled by etching time.

Next, after the removal of the etching mask 31, the semi-insulating Fe—InP layer 17 is grown on the n-InGaAs layer 25 functioning as the hole accumulation prevention layer and the multiplication layer 11 so as to bury the entire mesa-shaped multiplication layer 11 by MOCVD, and the n-InGaAs layer 6 is grown on the Fe—InP window layer 17. Subsequently, the diffusion mask 21 having an aperture which is larger than that of the mesa-shaped multiplication layer 11 is formed in the upper part of the mesa-shaped multiplication layer 11 of the n-InGaAs layer 6. After the diffusion source 22 such as ZnO/SiO$_2$ is formed on the etching mask 31 and on the above-described aperture, annealing is performed and Zn is diffused to form the p type region 5. This p type region 5 has a depth reaching the upper part of the multiplication layer 11. Then, the diameter of the aperture of the diffusion mask 21 is adjusted so that the edge part of the p type region 5 which is formed by the Zn diffusion is connected only with the Fe—InP layer 17 and is not connected with the multiplication layer 11. Then, in the step of FIG. 18(d), the p type contact layer 6, the reflection preventing film 7, the insulating film 9, the n side electrode, and the p side electrode are formed as in the sixth embodiment.

While in the general APD the depth of the p type region is changed according to the characteristic of the element, in the APD according to the sixth to ninth embodiments, since the multiplication layer 11 has a uniform thickness, when the p type region 5 reaches the multiplication layer 11, a part of the p type region 5 is always provided in the multiplication layer 11. Therefore, edge breakdown is likely to occur in the edge part in the multiplication layer 11.

However, in the tenth embodiment of the present invention, the multiplication layer 11 is formed just under the region where the p type region is to be formed and the p type region 5 is formed so that the bottom of the p type region 5 reaches the upper part of the multiplication layer 11 and the edge part of the p type region 5 is disposed entirely in the semi-insulating InP region 17. Therefore, it is possible to prevent edge breakdown by the time that the bottom part of the p type region reaches the upper part of the multiplication layer 11.

According to the tenth embodiment, since the multiplication layer 11 is formed in the mesa structure and disposed directly under the region where the p type region is to be formed and the edge part of the p type region is disposed entirely in the semi-insulating Fe—InP window layer 17, the same effect as in the sixth embodiment is achieved. Since the edge part of the p type region 5 is disposed entirely in the Fe—InP window layer 17 and the pn junction is not provided in the edge part, and edge breakdown is certainly prevented.

While, in the sixth to tenth embodiments, the contact layer 6 is formed between the p type region 5 and the p side electrode 8, in the present invention the contact layer may not be present if the p type region 5 is in ohmic contact with the p side electrode, with the same effects as in the first to fifth embodiments.

While, in the first to eighth, and the tenth embodiments, an Fe—InP window layer is used as the window layer, in the present invention in place of the Fe—InP window layer, a window layer comprising another semi-insulating semiconductor which can lattice-match with InP series material may be employed, with the same effects as in the above-described embodiments.

Embodiment 11

Figure 17:
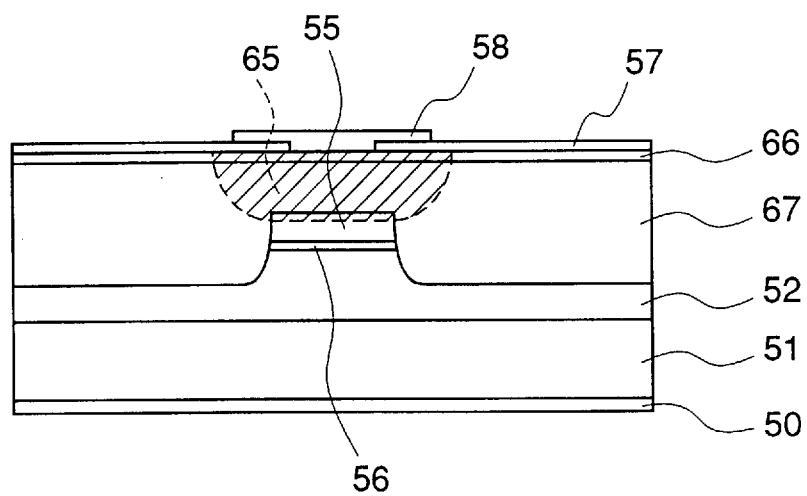
FIG. 17 is a cross-sectional view illustrating an LD according to an eleventh embodiment of the present invention.

FIG. 17 is a cross-sectional view illustrating a semiconductor laser according to an eleventh embodiment of the present invention. In FIG. 17, reference numeral 51 designates an n$^+$-InP substrate including an n type dopant impurity, such as S or Si, in a concentration of $5\times10^{18}$ cm$^{-3}$, numeral 52 designates an n-InP lower cladding layer including an n type dopant impurity in a concentration of $1\times10^{18}$ cm$^{-3}$, numeral 55 designates a first p-InP upper cladding layer including a p type dopant impurity in a concentration of $1\times10^{18}$ cm$^{-3}$, numeral 56 designates an undoped InGaAsP active layer, numeral 67 designates a semi-insulating Fe—InP layer including Fe in a concentration of $1\times10^{15}$ cm$^{-3}$~$1\times10^{18}$ cm$^{-3}$. Reference numeral 65 designates a p type region formed by Zn diffusion, including a p type dopant impurity in a concentration of $1\times10^{17}$ cm$^{-3}$~$1\times10^{20}$ cm$^{-3}$, and having a depth reaching the upper cladding layer 55. Reference numeral 57 designates an insulating film such as SiN. Reference numeral 58 designates a p side electrode and numeral 50 designates an n side electrode. Reference numeral 66 designates an n-InGaAs contact layer which becomes p type in the p type region 65 because of the Zn diffusion.

FIGS. 19(a)–19(d) are cross-sectional views illustrating process steps in a method of fabricating a semiconductor laser according to an eleventh embodiment of the present invention. In FIGS. 19(a)–19(d), the same reference numerals as in FIG. 17 designate the same or corresponding parts, and reference numeral 61 designates a diffusion mask comprising an insulating film, such as SiO$_2$, numeral 62 designates a solid phase diffusion source including a p type dopant impurity such as Zn, and numeral 63 designates a stripe-shaped etching mask.

Figure 19:
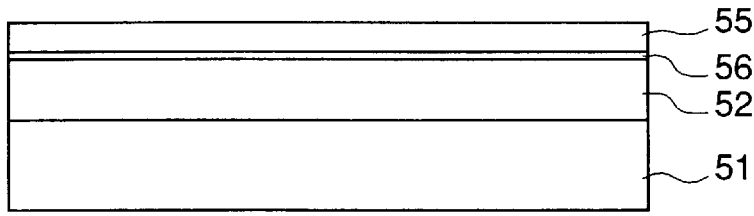
FIGS. 19(a)–19(d) are cross-sectional views illustrating process steps in a method of fabricating an LD according to an eleventh embodiment of the present invention.
Figure 19:
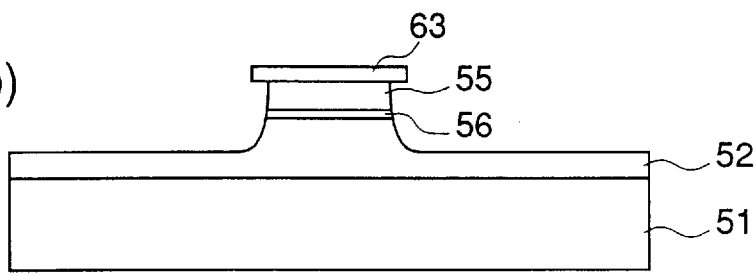
Figure 19:
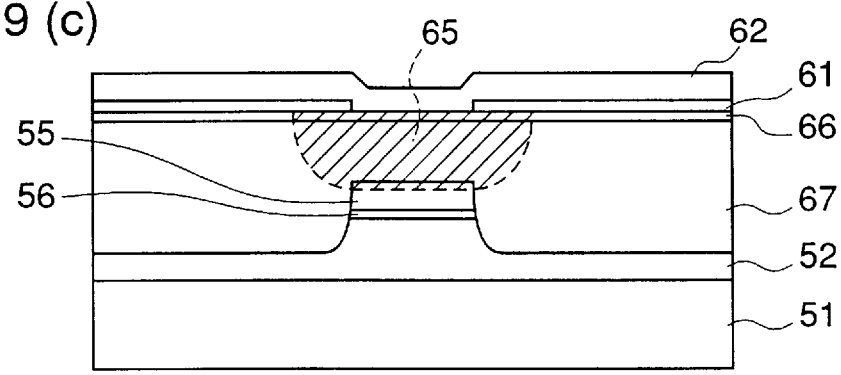
Figure 19:
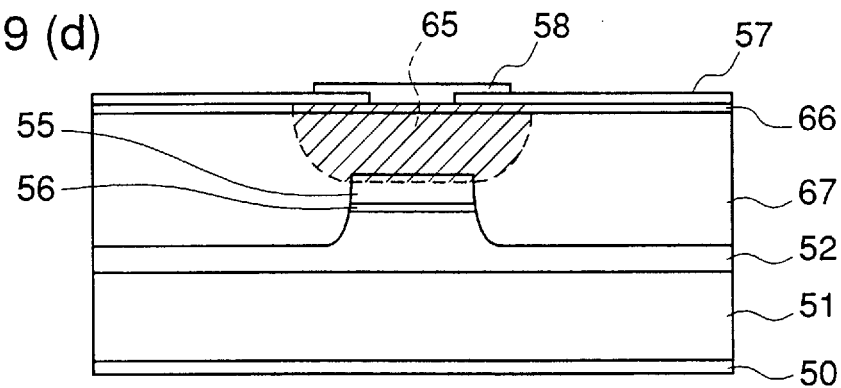

Next, a description is given of the fabricating method according to the eleventh embodiment. In the step of FIG. 19(a), the n-InP lower cladding layer 52, the InGaAs active layer 56, and the p-InP upper cladding layer 55 are successively epitaxially grown on the n-InP substrate 51 by MOCVD.

Subsequently, in the step of FIG. 19(b), the stripe-shaped etching mask 63 comprising the SiO$_2$ insulating film is formed on the p-InP upper cladding layer 55, and using this mask, the semiconductor layers grown by epitaxial growth are etched to the lower cladding layer 52 to form a stripe-shaped mesa structure. The etching is performed by the Br series etchant.

Next, after the removal of the etching mask, the Fe—InP layer 67 is grown by MOCVD so as to bury the whole mesa structure, and the contact layer 66 is formed on the Fe—InP layer 67 subsequently. Then, on the contact layer 66, the SiO$_2$ diffusion mask 61 having an aperture above the mesa structure and the solid diffusion source 62 comprising ZnO/SiO$_2$ are formed, and annealing is performed to form the p type region by diffusing Zn to reach the upper cladding layer 55 of the mesa structure, as shown in FIG. 19(c). After the removal of the solid diffusion source 62 and the diffusion mask 61 by a hydrofluoric acid series etchant, the SiN insulating film 57 having the aperture above the mesa structure is formed on the contact layer 66, and the p side electrode 58 is formed in the aperture of the insulating film 57 and the vicinity of the aperture, and the n side electrode 50 is formed on the rear surface of the substrate 51, as shown in FIG. 19(d).

A description is given of the operation. When a current flows so that the p side electrode 58 becomes plus and the n side electrode 50 becomes minus, the carriers injected from the respective electrodes reach the active layer 56 of the mesa structure, light emissive recombination of carriers occurs and the light generated is guided along the active layer 56, and emitted as a laser beam. The carriers injected from the n side electrode 58 and the p side electrode 50 do not flow other than in the region of the mesa structure, since the semi-insulating Fe—InP layer 67 is present.

In the prior art semiconductor laser, since the mesa structure is formed as a structure confining current, and the mesa structure is buried with the p type InP current blocking layers 53 and the n-InP current blocking layers 54, and the second p type InP upper cladding layer 55b is disposed on the mesa structure and on the n-InP current blocking layers 54, it is necessary to perform three epitaxial growth processes, that is, forming the mesa structure, burying the mesa structure, and forming the second p type InP upper cladding layer 55b, and the fabricating processes are quite complicated. However, in the eleventh embodiment of the invention, since only two epitaxial growth processes, that is, forming the mesa structure and burying the mesa structure, are satisfactory, a simple fabricating method is achieved.

In the eleventh embodiment, the mesa structure is formed, the semi-insulating Fe—InP layer 67 is formed so as to bury the whole mesa structure, the p type region 65 having a depth reaching the mesa structure of the upper cladding layer 55 is formed only above the mesa structure by Zn diffusion, the p side electrode 58 is formed on the p type region, and current can flows in this mesa structure through the p type region 65. Therefore, since only two epitaxial growth processes, that is, forming the mesa structure and burying the mesa structure, are satisfactory, a simple fabricating method is achieved.

While in the eleventh embodiment, a description is given of the method of fabricating a semiconductor laser having the mesa structure, in the present invention the semiconductor laser having the current confining structure, in which the doublehetero structure having the mesa structure of the described depth, such as the semiconductor laser having the buried ridge structure, buried by current blocking layers, may be employed with the same effect as in the eleventh embodiment.

While in the eleventh embodiment the Fe—InP layer is used as the layer burying the mesa structure, in the present invention the semi-insulating InP layer doped other impurity may be used in place of Fe, with the same effect as in the eleventh embodiment.

While in the eleventh embodiment the Fe—InP layer is used as the layer burying the mesa structure, in the present invention another semi-insulating layer that lattice-matches with the InP series material may be used in place of the Fe—InP layer, with the same effect as in the eleventh embodiment.

While, in the first to eleventh embodiments, the semiconductor devices, such as the pin PD, the APD, and the LD, include an n type InP substrate, in the present invention a p type InP substrate may be used as the substrate, with the same effects as in the above-described embodiments.

While in the first to eleventh embodiments, the semiconductor devices, such as the pin PD, the APD, and the LD, include InP series material, in the present invention other materials besides InP series material may be used, with the same effects as in -the above-described embodiments.

In addition, while in the first to eleventh embodiments, the pin PD, the APD, and the LD are employed as the semiconductor device, in the present invention another semiconductor device, such as a field effect transistor, may be employed, with the same effects as in the above-described embodiments.

What is claimed is:

1. A semiconductor device comprising:

a semi-insulating semiconductor substrate having an energy band gap;

a light absorbing layer comprising a first conductivity type material having an energy band gap smaller than the energy band gap of the semi-insulating substrate and located on only part of the semi-insulating semiconductor substrate;

a semi-insulating semiconductor layer having an energy band gap larger than the energy band gap of the light absorbing layer and disposed on the light absorbing layer and on the semi-insulating semiconductor substrate;

a second conductivity type semiconductor region in the semi-insulating semiconductor layer, having a depth reaching the light absorbing layer, and disposed opposite the light absorbing layer;

a first conductivity type semiconductor region in the semi-insulating semiconductor layer, having a depth reaching the light absorbing layer, and disposed opposite the light absorbing layer and spaced from the second conductivity type semiconductor region;

a first electrode disposed on the surface of the semi-insulating semiconductor layer in ohmic contact with the first conductivity type region; and a second electrode having a bonding pad region located opposite the semi-insulating semiconductor layer but not opposite the light absorbing layer and having a contact region extending from the bonding pad region and in ohmic contact with the second conductivity type semiconductor region on the surface of the semi-insulating semiconductor layer.

2. The semiconductor device of claim 1 wherein:

the semi-insulating semiconductor substrate comprises InP;

the light absorbing layer comprises n type InGaAs;

the semi-insulating semiconductor layer comprises Fe-doped InP; and the second conductivity type semiconductor region is a p type region.

* * * * *